United States Patent
Chang

(10) Patent No.: US 10,128,307 B2
(45) Date of Patent: Nov. 13, 2018

(54) MICROLED DISPLAY AND ASSEMBLY

(71) Applicant: Intel Corporation, Santa Clara, CA (US)

(72) Inventor: Peter L. Chang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 38 days.

(21) Appl. No.: 15/512,526

(22) PCT Filed: Oct. 17, 2014

(86) PCT No.: PCT/US2014/061052
§ 371 (c)(1),
(2) Date: Mar. 20, 2017

(87) PCT Pub. No.: WO2016/060676
PCT Pub. Date: Apr. 21, 2016

(65) Prior Publication Data
US 2018/0233536 A1    Aug. 16, 2018

(51) Int. Cl.
| | |
|---|---|
| *H01L 33/00* | (2010.01) |
| *H01L 27/15* | (2006.01) |
| *H01L 33/56* | (2010.01) |
| *H01L 33/62* | (2010.01) |
| *H01L 33/38* | (2010.01) |

(52) U.S. Cl.
CPC .......... *H01L 27/156* (2013.01); *H01L 33/385* (2013.01); *H01L 33/56* (2013.01); *H01L 33/62* (2013.01)

(58) Field of Classification Search
None
See application file for complete search history.

(56) References Cited

U.S. PATENT DOCUMENTS

| | | |
|---|---|---|
| 2011/0136324 A1 | 6/2011 | Ashdown |
| 2012/0038047 A1 | 2/2012 | Do et al. |
| 2013/0285107 A1 | 10/2013 | Schubert et al. |
| 2013/0313587 A1 | 11/2013 | Lin |

(Continued)

OTHER PUBLICATIONS

International Search Report and Written Opinion for PCT/US14/61052 dated Jun. 29, 2015, 14 pages.

(Continued)

*Primary Examiner* — Reema Patel
(74) *Attorney, Agent, or Firm* — Green, Howard, & Mughal LLP

(57) ABSTRACT

Crystalline (micro)LED display assemblies, methods of fabricating such display assemblies, crystalline LED source substrates from which the (micro)LEDs may be transferred to the display assembly, and methods of fabricating such source substrates. LED elements may be prepared for transfer by pick-n-place or other means to a bonding substrate. Anchor and release structures enable LED elements to be affixed and electrically coupled to a bonding substrate with conductive polymer. LED elements may be prepared for transfer to a bonding substrate with self-aligned LED electrode metallization structures enabling the elements to be affixed to a bonding substrate with an adhesive and electrically coupled with a self-aligned local interconnect metallization. After affixing the LED elements, material may be built-up around the LED elements and the display assembly separated from the bonding substrate.

18 Claims, 20 Drawing Sheets

(56) References Cited

U.S. PATENT DOCUMENTS

2014/0048825 A1 2/2014 Hsieh
2014/0084240 A1 3/2014 Hu et al.
2014/0094878 A1 4/2014 Gossler et al.
2014/0240618 A1 8/2014 Oraw

OTHER PUBLICATIONS

European Extended Search Report for European Patent Application No. 14904106, dated Feb. 14, 2018.
Annaiyan, U et al., "Development of a Conductive Photoresist with a mixture of SU-8 and HCl doped polyaniline", RMIT University. Downloaded on Aug. 6, 2009.
Bower, C.A. et al., "Active-Matrix OLED Display Backplanes Using Transfer-Printed Microscale Integrated Circuits", IEEE; 2010 Electronic Components and Technology Conference, pp. 1339-1343.
Park, S et al., "Printed Assemblies of Inorganic Light-Emitting Diodes for Deformable and Semitransparent Dipslays", Science (print ISSN 0036-8075; online ISSN 1095-9203), American Association for the Advancement of Science, 1200 New York Avenue NW, Washington, DC 20005. Copyright 2009 by the American Association for the Advancement of Science.
Park, S et al., "Printed Assemblies of Inorganic Light-Emitting Diodes for Deformable and Semitransparent Displays", www.sciencemag.org/cgi/content/full/325/5943/977/DC1; Published Aug. 21, 2009, Science 325, 977 (2009); DOI: 10.1126/science.1175690.
Rogers, J.A. et al., "High-Efficiency, Microscale GaN Light-Emitting Diodes and Their Thermal Properties on Unusual Substrates", small 2012, vol. 8, No. 11, Jun. 11, 2012, pp. 1643-1649.

MICROLED DISPLAY AND ASSEMBLY

CLAIM OF PRIORITY

This application is a National Phase Application of, and claims priority to, PCT Application No. PCT/US14/61052, filed on 17 Oct. 2014, titled "MICROLED DISPLAY & ASSEMBLY", which is incorporated by reference in its entirety for all purposes.

BACKGROUND

Display technology has advanced rapidly in recent years as an important user interface to electronic devices. To date, liquid crystal display (LCD) technology has been the dominant display technology for both large format (e.g., television) and mobile devices. Current LCD based displays however only pass through ~5% of light from a backlight source (e.g., LED or CFL, etc.) leading to poor power efficiency, insufficient daylight display illumination, and poor viewing angles.

Considerable research and development has been expended on organic light emitting diode (OLED) display technology. OLED displays improve display power efficiency, though not dramatically, relative to LCD. OLED technology also currently suffers from color fading, leading to decreased display endurance/lifetime.

Another next-gen display technology under investigation is crystalline LED, also referred to as inorganic LED (iLED). A crystalline LED display relies on an array of crystalline semiconductor LED chips. A crystalline LED display, for example, may utilize one LED chip for one picture element, or pixel. The power efficiency of crystalline LED is one order of magnitude more efficient than that of OLED, however a high volume manufacturing process has not been demonstrated for display applications. One of the technical challenges of crystalline LED is that a vast number of very small crystalline LEDs need to be transferred from a monolithic growth/fabrication medium into a spatially larger array electrically interconnected in a manner that enables controlled light emission. For current display resolutions (e.g., HD), one may expect hundreds of thousands of crystalline LED elements within a 1" square of display area with each crystalline LED element on the micron scale (e.g., 5 µm, or less on a side). The great number of devices and their small size has made micro scale assembly a challenging regime between monolithic devices and conventional millimeter pick-and-place assemblies.

As such, crystalline LED displays and technology for assembly of such displays would be advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
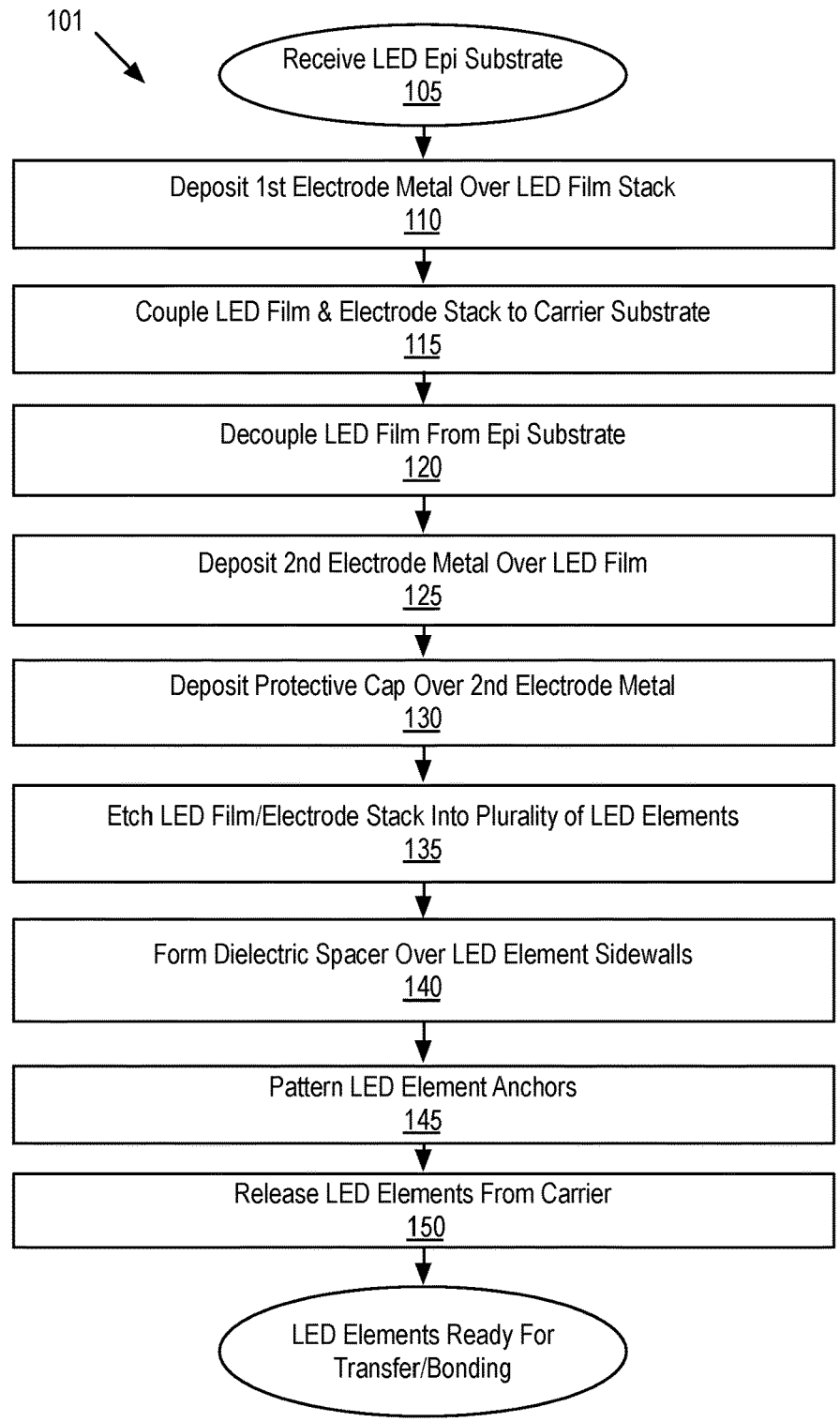
FIG. 1 is flow diagram illustrating a method of fabricating crystalline LED elements suitable for assembly into a display, in accordance with embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments of the present invention may be practiced without these specific details. In some instances, well-known methods and devices are shown in block diagram form, rather than in detail, to avoid obscuring embodiments of the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used in the description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Described herein are crystalline (micro)LED display assemblies, methods of fabricating such display assemblies, crystalline LED source substrates from which the LEDs may be transferred to the display assembly, and methods of fabricating such source substrates. The techniques and display assemblies are particularly advantageous for integrating hundreds of thousands to many millions of μLED into a display. A μLED, also simply referred to herein as an LED, has a largest lateral dimension on the micron scale, and advantageously has a longest lateral length no more than 5 μm. Display assembly embodiments, source substrate embodiments, and fabrication techniques exemplified herein are highly scalable being suitable for LEDs in the 1-5 μm range, for example. Although described herein in the context of a few or even a single LED for the sake of clarity, the source substrate embodiments, and techniques exemplified are also understood to be applicable to concurrent fabrication/assembly of a vast number LEDs.

FIG. 1 is flow diagram illustrating a method 101 of fabricating crystalline LED elements suitable for assembly into a display, in accordance with embodiments. Method 101 may be utilized to fabricate an LED source substrate, from which LED elements may be transferred to assemble a crystalline LED display. FIG. 2A-2K are cross-sectional and plan views of exemplary crystalline LED elements as illustrative operations of the method 101 are performed, in accordance with embodiments.

Method 101 entails wafer-level processing suitable for generating the LED source substrate from a semiconductor LED film stack received at operation 105. The semiconductor LED film stack may be a contiguous film covering an epitaxial substrate to form a monolithic body (e.g., an LED epi wafer). Generally, any known semiconductor LED film stack may be utilized. In the exemplary embodiment illustrated in FIG. 2A, epi wafer 201 includes an epitaxial substrate 205, a buffer layer 206 and a semiconductor LED film stack 207 epitaxially grown on buffer layer 206. In embodiments, LED film stack 207 includes one or more semiconductor heterojunction, for example forming a quantum well, etc. Semiconductor LED film stack 207 includes at least two complementary doped semiconductor regions (layers); a p-type doped layer and an n-type doped layer in a diodic stack architecture. In specific embodiments, semiconductor LED film stack 207 is a heteroepitaxial III-N semiconductor film stack, for example comprising GaN and/or alloys thereof, such as InGaN. The composition of semiconductor LED film stack 207 however is dependent on the desired emission band, and embodiments herein are not limited in that respect.

Epitaxial substrate 205 may be any know substrate suitable for growing an LED semiconductor film stack. For example, substrate 205 may be a variety of materials, including, but not limited to, silicon, germanium, SiGe, III-V compounds like GaAs, InP, III-N compounds like GaN, 3C—SiC, and sapphire to name a few. Buffer layer(s) 206 may be of any known architecture suitable for transitioning from the composition/microstructure of epitaxial substrate 205 to that of LED film stack 207.

Figure 2A:
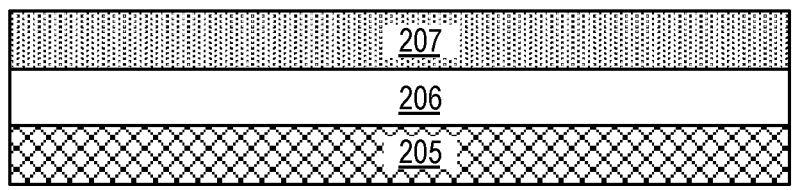
FIGS. 2A, 2B, 2C, 2D, 2E, 2F, and 2G are cross-sectional views of exemplary crystalline LED elements as illustrative operations of the method illustrated in FIG. 1A are performed, in accordance with embodiments.
Figure 2B:
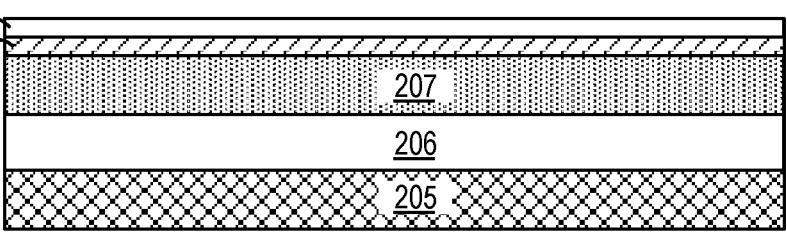
Figure 2C:
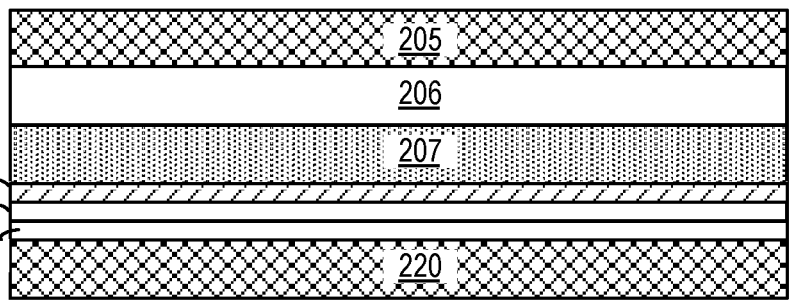
Figure 2D:
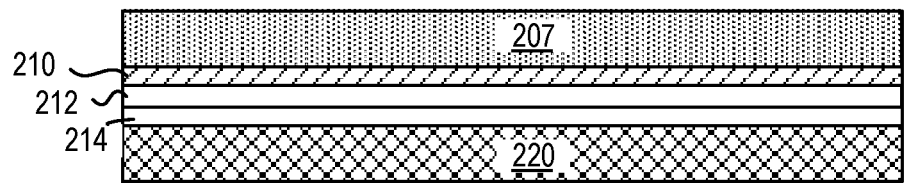
Figure 2E:
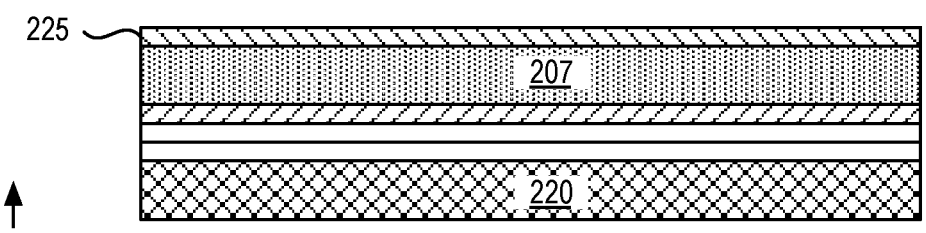
Figure 2F:
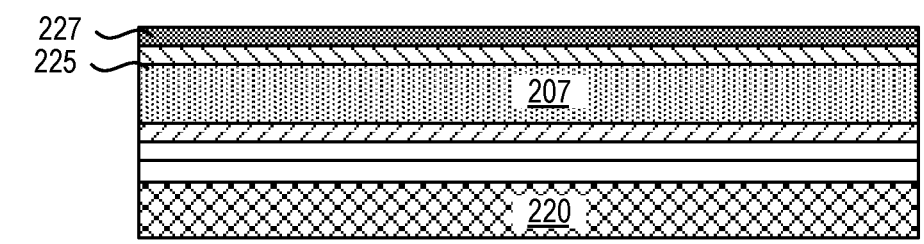

Returning to FIG. 1, method 101 continues with operation 110 where an electrode metal is deposited over the LED film stack. The composition of electrode metal may vary as a function of the LED film stack, for example to provide a desired metal work function suitable for providing an ohmic contact, tunneling contact, etc. In one exemplary embodiment, the metal deposited at operation 110 is a p-type metal suitable for making contact to p-type doped semiconductor layer of an LED film stack. Any known deposition technique, such as but not limited to PVD, CVD, electrolytic, or electroless plating may be utilized at operation 110. As further illustrated in FIG. 2B, a p-type metal film 210 is blanket deposited over a p-type doped semiconductor layer of an LED film stack 207. As also illustrated in FIG. 2B, a bonding/release material layer 212, for example a dielectric such $SiO_x$, may be further deposited over p-type metal film 210.

Returning to FIG. 1, method 101 continues with operation 115 where the LED film and metal electrode stack is coupled to a carrier. At operation 120, the LED and metal electrode stack is decoupled from the LED epi substrate. Operations 115 and 120 implement a wafer-level thin film transfer allowing the LED film stack to be sandwiched between two opposing metal electrodes. The wafer-level film transfer operations 115 and 120 may not be needed if the LED epi substrate received at operation 105 already included a metal electrode film buried below the LED film stack. As one example, the wafer-level thin film transfer described here in the context of operations 115 and 120 may be performed upstream of method 101. At operation 115 any technique known in the art may be utilized to couple the LED film and electrode stack to a carrier. In one embodiment, the coupling is long-term stable, for example using any (thermal) compression bonding between LED film and electrode stack to a carrier. In another embodiment, the coupling is shorter term, for example using an electrostatic coupling between the LED film and electrode stack and carrier. At operation 120 any technique known in the art may be utilized to decoupled the LED film and electrode stack from the epitaxial substrate. For example a laser liftoff or CMP/grind and clean may be utilized to remove the epitaxial substrate. In the exemplary embodiment illustrated in FIG. 2C, bonding material layer 212 (e.g., $SiO_x$ adhesive) is compression/thermal/UV bonded with carrier 220 that further includes another bonding material layer 214 (e.g., $SiO_x$ adhesive). Alternatively, only one of bonding material 212 or 214 may be present. Carrier 220 may be any metal, semiconductor, or dielectric material having adequate flatness and subsequent bulk transfer of the LED elements from carrier 220 may be facilitated by greater flatness of carrier 220. In one advantageous embodiment, carrier 220 is a (mono)crystalline silicon substrate, for example a wafer of the type employed for IC fabrication. As further illustrated in FIG. 2D, decoupling of the LED film from the epitaxial substrate 205 (e.g., by laser liftoff) exposes a second doped semiconductor region (e.g., n-type doped layer) of the LED film stack 207.

Returning to FIG. 1, method 101 continues at operation 125 where a second metal electrode film is deposited over the surface of the LED film stack exposed by operation 120. The composition of the second electrode metal may vary as a function of the LED film stack, for example to provide a desired metal work function suitable for providing an ohmic contact, tunneling contact, etc. In one exemplary embodiment, the metal deposited at operation 125 is an n-type metal suitable for making contact to n-type doped semiconductor layer of an LED film stack. Any known deposition technique, such as but not limited to PVD, CVD, electrolytic, or electroless plating may be utilized at operation 125. As further illustrated in FIG. 2E, n-type metal film 225 is blanket deposited over an n-type doped semiconductor layer of an LED film stack 207.

Returning to FIG. 1, method 101 continues at operation 130 where a protective dielectric capping material is deposited over the second metal electrode film. Operation 130 is optional, but advantageously protects the LED electrode metal from erosion during subsequent processing. The dielectric capping material may be of any material known in the art to be suitable for the purpose. Any known deposition technique, such as but not limited to PVD and CVD may be utilized at operation 130. As further illustrated in FIG. 2F, a carbon doped silicon nitride (CDN) film 227 is blanket deposited over the n-type metal LED electrode film 225.

Returning to FIG. 1, method 101 continues at operation 135 where a plurality of LED elements is formed by etching trenches into the LED semiconductor film stack. Any known photolithographic mask patterning and thin film etching process may be utilized at operation 135. The dimensions of the mask features at operation 135 substantially set the dimensions of the LED elements that will be incorporated into a display. In advantageous embodiments, the etching operation 135 etches through the first metal electrode film, through the second metal electrode film, and through the entire semiconductor LED film stack between the two electrodes defining sidewalls of each LED element. With this technique, the footprint of the first metal electrode is at least equal to the area occupied by the LED semiconductor film stack and second electrode (i.e., both LED electrodes have the same footprint and are coincident with the semiconductor film stack). At operation 140, a dielectric sidewall spacer is formed over the LED element sidewalls. Any known dielectric material, such as but not limited to SiOx, SiON, SiN, CDO, and CDN may be conformally deposited over the LED elements. An anisotropic etch is then performed using any anisotropic etch process known in the art to be suitable for the chosen dielectric material to form an at least partially self-aligned sidewall coating over the metal and semiconductor sidewalls of each LED element. As described further below, the dielectric spacer sidewall coatings enable the subsequent anchoring process to be independent of LED encapsulation. The degrees of freedom provide by the dielectric spacer sidewall coatings may further enable the anchoring force to be modulated to strengths below what might be possible if for example an anchoring material is employed also for LED encapsulation.

Figure 2G:
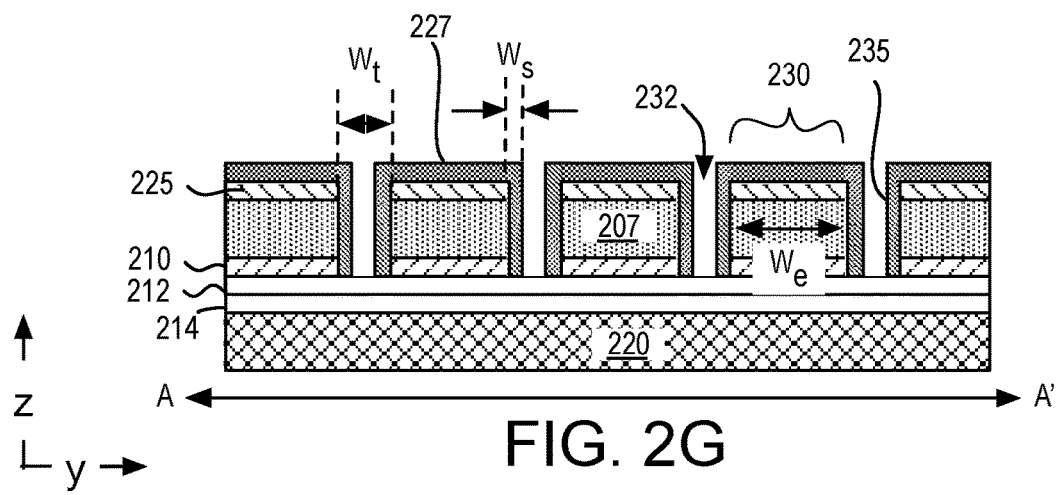
Figure 2H:
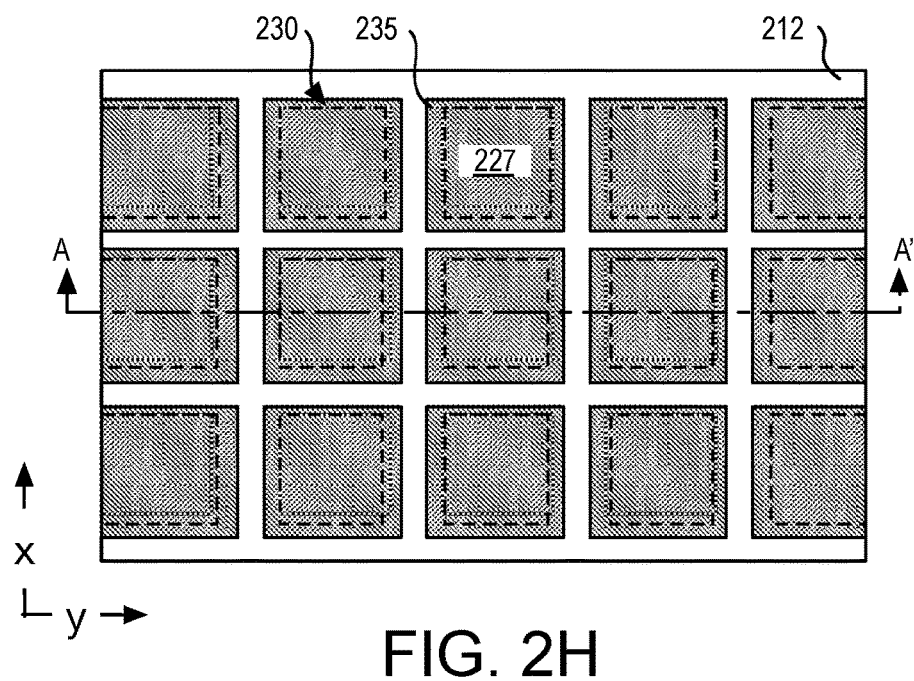
FIG. 2H is a plan view of the crystalline LED elements depicted in FIG. 2G, in accordance with embodiments.
Figure 2I:
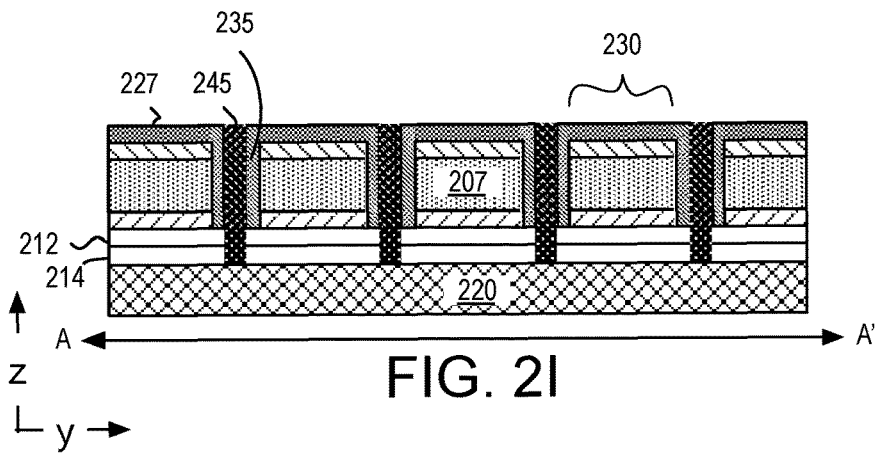
FIG. 2I is a cross-sectional view of exemplary crystalline LED elements as an illustrative operation of the method illustrated in FIG. 1A is performed, in accordance with embodiments.
Figure 2J:
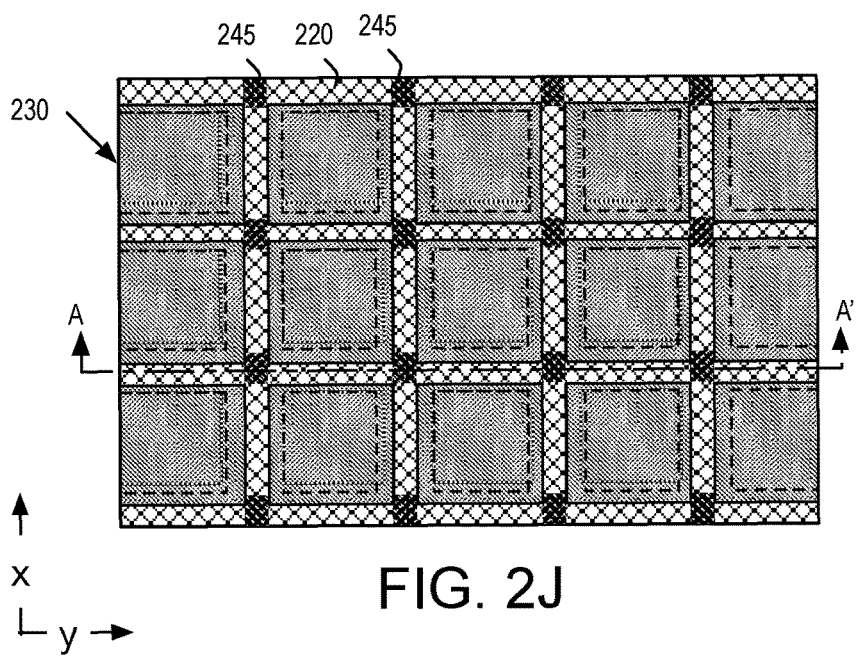
FIG. 2J is a plan view of the crystalline LED elements depicted in FIG. 2I, in accordance with embodiments.

FIG. 2G is a cross-sectional view of crystalline LED elements 230 following their delineation at operation 135 and encapsulation by dielectric spacer at operation 140. In exemplary embodiments, the lateral element width $W_e$ of each LED element 230 is patterned to be no more than 5 μm. As further depicted, spacer dielectric 235 (e.g., CDN) serves as a self-aligned sidewall dielectric coating on the LED elements 230. In embodiments including capping layer 227, LED elements 230 may be encapsulated on 5/6 sides by one or more dielectric material (e.g., CDN). In advantageous embodiments, the thickness of the dielectric material utilized for spacer formation is selected to ensure dielectric spacer 235 has a lateral thickness, or width $W_s$ that is less than half the nominal lateral width $W_t$ of the trenches 232 etched into the LED film stack at operation 135 (FIG. 1). The limitation on spacer width ensures two dielectric spacers on adjacent LED elements leave a portion of substrate material (e.g., bonding material 212) exposed at the bottom of trench 232. FIG. 2H is a top down plan view of crystalline LED elements 230 at the same stage as FIG. 2G, in accordance with embodiments. Although LED elements 230 are rectangular (e.g., square) in the exemplary embodiment illustrated in FIG. 2G, LED elements 230 may be patterned to have alternative shapes (e.g., a circular footprint).

Returning to FIG. 1, method 101 continues at operation 145 where LED element anchors are patterned in preparation for a controlled release of the LED elements from the carrier. The LED element anchors are formed within the trenches etched at operation 135, intersecting portions of the LED element sidewalls while still leaving access for a release agent to undercut the LED elements. With the presence of the dielectric spacer coating sidewalls of the LED elements, the LED anchors may be formed independent of concerns associated with encapsulation of the LED elements. In the exemplary embodiment illustrated in FIG. 2I, at least a portion of one or more of bonding material layers 212, 214 are recessed. In such an embodiment, the material layers 212, 214 are functionally both bonding and release layers. In alternative embodiments, the release layer recessed as part of the LED element anchoring operation is distinct from the bonding layer. The release layer may be recessed below dielectric spacer 235 with a blanket etch process masked by dielectric spacer 235 and capping material 227 protecting LED elements 230. In the illustrated embodiment, an anisotropic etch through material layers 212, 214 stops on carrier 220. Anchor material is then deposited into the recessed trenches between adjacent LED elements 230, filling at least the recessed release layer and a portion of the trench lined by the dielectric spacer. Anchor material may be back filled into the trenches, planarizing with a top surface of LED elements 230, for example with a spin-on process. The planarized anchor material may then be patterned into a plurality of separate anchors. The degrees of freedom provide by the dielectric spacer sidewall coatings may enable the anchoring force to be modulated by reducing the anchor points below what might be possible if for example an anchoring material is also employed for LED encapsulation. In one advantageous embodiment, the anchor material is a photosensitive polymeric material (e.g., photoresist) spin-coated into the trenches. The photoresist is then lithographically patterned (i.e., exposed and developed) into separate LED element anchors 245 filling the trench and maintaining separation between adjacent LED elements 230 as further illustrated in FIG. 2J, which is a plan view of the crystalline LED elements 230 depicted in FIG. 2I, in accordance with embodiments.

Figure 2K:
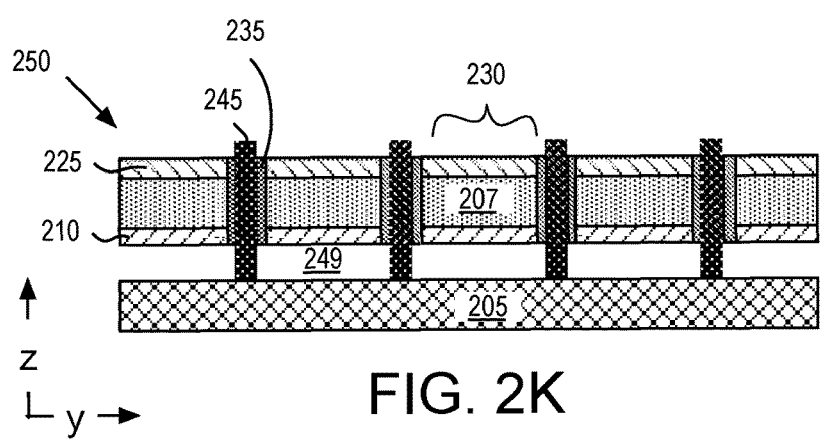
FIG. 2K is a cross-sectional view of exemplary crystalline LED elements following completion of the method illustrated in FIG. 1A, in accordance with embodiments.

Returning to FIG. 1, method 101 continues at operation 150 where the anchored LED elements are controllably released from the carrier. After release operation 150, the LED elements remain affixed to the carrier only by the anchors formed at operation 145. In embodiments, LED elements are released from carrier by laterally etching a release layer disposed between the LED elements and the carrier. FIG. 2K is a cross-sectional view of a crystalline LED bonding source substrate 250 following completion of method 101, in accordance with embodiments. As shown, a source LED bonding/release layers 212, 214 are laterally etched, for example with any isotropic dry or wet chemical etchant (e.g., HF), undercutting the plurality of crystalline LED elements 230. Anchors 245 landing on carrier 220 are then surrounded by a free-space void 249 extending over the entire lateral area or footprint of each LED element 230. In the exemplary embodiments where a photosensitive polymer is employed for the anchor material, each anchor 245 is a polymer pillar contacting the sidewall dielectric (spacer 235) coating at least two adjacent LED elements 230 (e.g., four nearest LED elements 230 are connected by each anchor 245). In the exemplary embodiment where there a dielectric capping material was applied over the second metal LED electrode 225, this dielectric capping material may be removed to re-expose second metal LED electrode 225 in preparation for transfer of the LED elements to a display assembly. As further illustrated in FIG. 2K, following removal of dielectric capping material 227, a top surface of sidewall dielectric 235 is planar with the exposed surface of the first metal electrode 210 as well as the exposed surface of the second metal electrode 227. Depending on the selectivity of the technique employed to remove the capping material, anchors 245 may extend above the exposed surface of second metal electrode 227, as depicted in FIG. 2K. Alternatively, anchors 245 may be recessed or substantially planar with the exposed surface of second metal electrode 227. Method 101 is then substantially complete with the LED elements now ready for pick up and bonding to an LED display assembly.

In a further embodiment, method 101 may be modified slightly to split each LED element described above into a plurality of LEDs for the sake of electrical redundancy sufficient to avoid the need to electric test each LED element. Given the micrometer lateral dimensions of each LED element e-testing each element may be impractical, yet any given LED element may be inoperable as a function of the LED element yield (e.g., due to defects the semiconductor LED film stack). In advantageous embodiments therefore, one or more intra-element trench is etched through the second metal electrode film and the LED semiconductor film stack of each LED element described above. The LED element is thereby split into a sufficient number of LEDs that at least one LED in every LED element has a very high probability of functioning. The number of LEDs needed within each element is a function of defect density/clustering. The intra-element trench is stopped on the first metal LED electrode so that all the LEDs within each element are electrically coupled in parallel by the first metal LED electrode. For such embodiments, the trench etch operation 135 may entail two masking operations: one defining the inter-element trenches described above, and another defining the intra-element trenches. The two mask etches may be performed in any manner known in the art. Following the two-stage trench etching operation, dielectric spacer formation at operation 140 is further utilized to completely backfill the intra-element trenches.

Figure 3A:
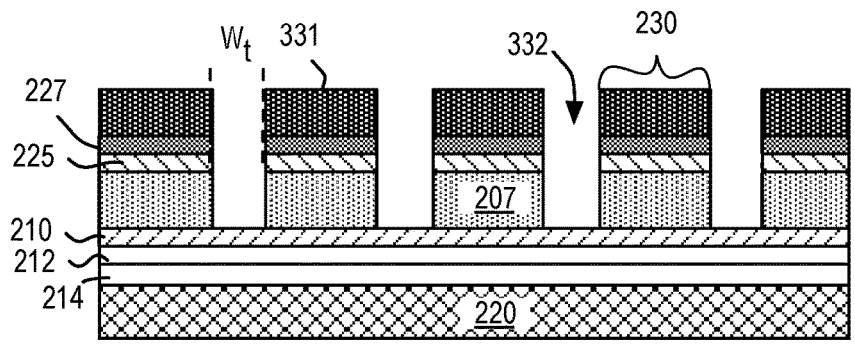
FIGS. 3A, 3B, 3C, 3D, and 3E are cross-sectional views of exemplary crystalline LED elements as illustrative operations of the method illustrated in FIG. 1A are performed in accordance with alternative embodiments.
Figure 3B:
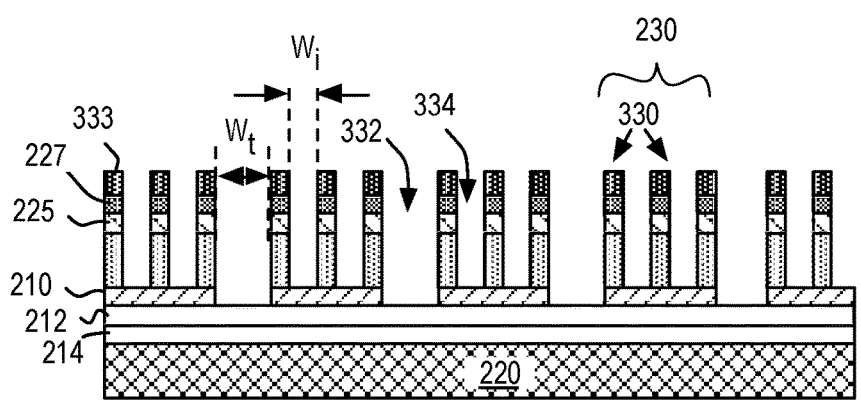
Figure 3C:
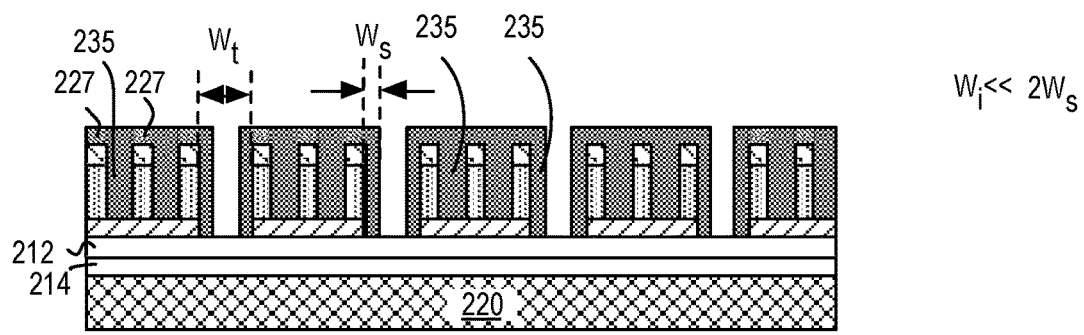
Figure 3D:
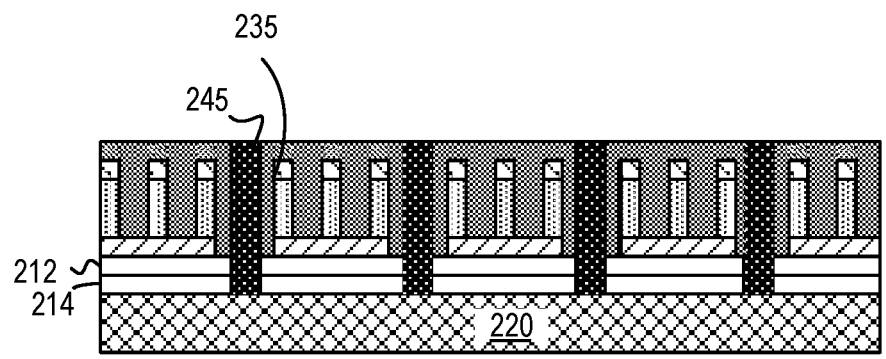
Figure 3E:
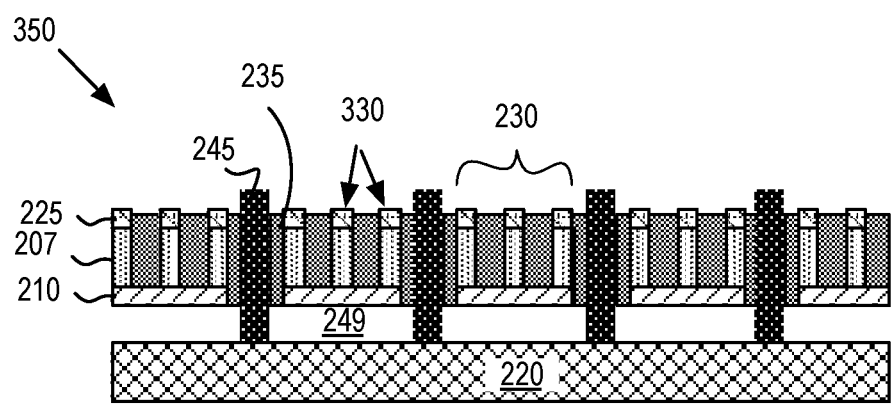

FIGS. 3A, 3B, 3C, 3D, and 3E are cross-sectional views of exemplary crystalline LED elements as illustrative operations of the method 101 are performed in accordance with alternative embodiments where each LED element is split into a plurality of LEDs. FIG. 3A illustrates a first masked trench etch delineating separate LED elements. A mask 331 defines the locations of inter-element trenches 332 separating adjacent LED elements 230. The inter-element trench etch may be substantially as described above in the context of operation 135, however the etch is stopped before clearing the LED element stack (e.g., stopped on the first metal electrode film 210). FIG. 3B illustrates a second masked trench etch delineating separate LED pillars within each LED element. A mask 333 defines the locations of intra-element trenches 334 separating adjacent LED pillars 330 within each LED element 230. Features for the mask 333 may have lateral CD in the sub-micron regime, for example. The intra-element trench etching may be substantially as described above in the context of operation 135, however the etching is stopped before clearing the LED element stack (e.g., stopped on the first metal electrode film 210. As mask 333 leaves open inter-element trenches 332, the etch front within trenches 332 proceeds through first metal electrode film 210 during the etching of the intra-elements trenches, thereby completing delineation of the LED elements 230. FIG. 3C further illustrates dielectric spacer formation (e.g., performed at operation 140 in FIG. 1). In advantageous embodiments where intra-element trenches 334 have a lateral width $W_t$ that is less than twice the lateral width $W_s$ of the sidewall dielectric spacers 235, dielectric spacer 235 backfills intra-element trenches 334. Inter-element trenches 332 are not completely backfilled with spacer dielectric and therefore bonding/release material layer 212/214 may be recessed during formation of LED element anchors substantially as described above and as further depicted in FIGS. 3D and 3E. As shown in FIG. 3E, crystalline LED bonding source substrate 350 has many of the structural features described above for crystalline LED bonding source substrate 250, with the addition of redundant LEDs 330 in each element 230. Method 101 is again substantially complete with the LED elements of the LED bonding source substrate 350 now ready for pickup/bonding to an LED display assembly. The redundant LEDs are useful for repairing defects. Upon inspection, a defective LED 330 can be disconnected by removing the metal connection to the top electrode with a focused ion beam. The electrical current will be redistributed among the remaining good LEDs. Current will then set the light emission independent of the defective elements.

Figure 4:
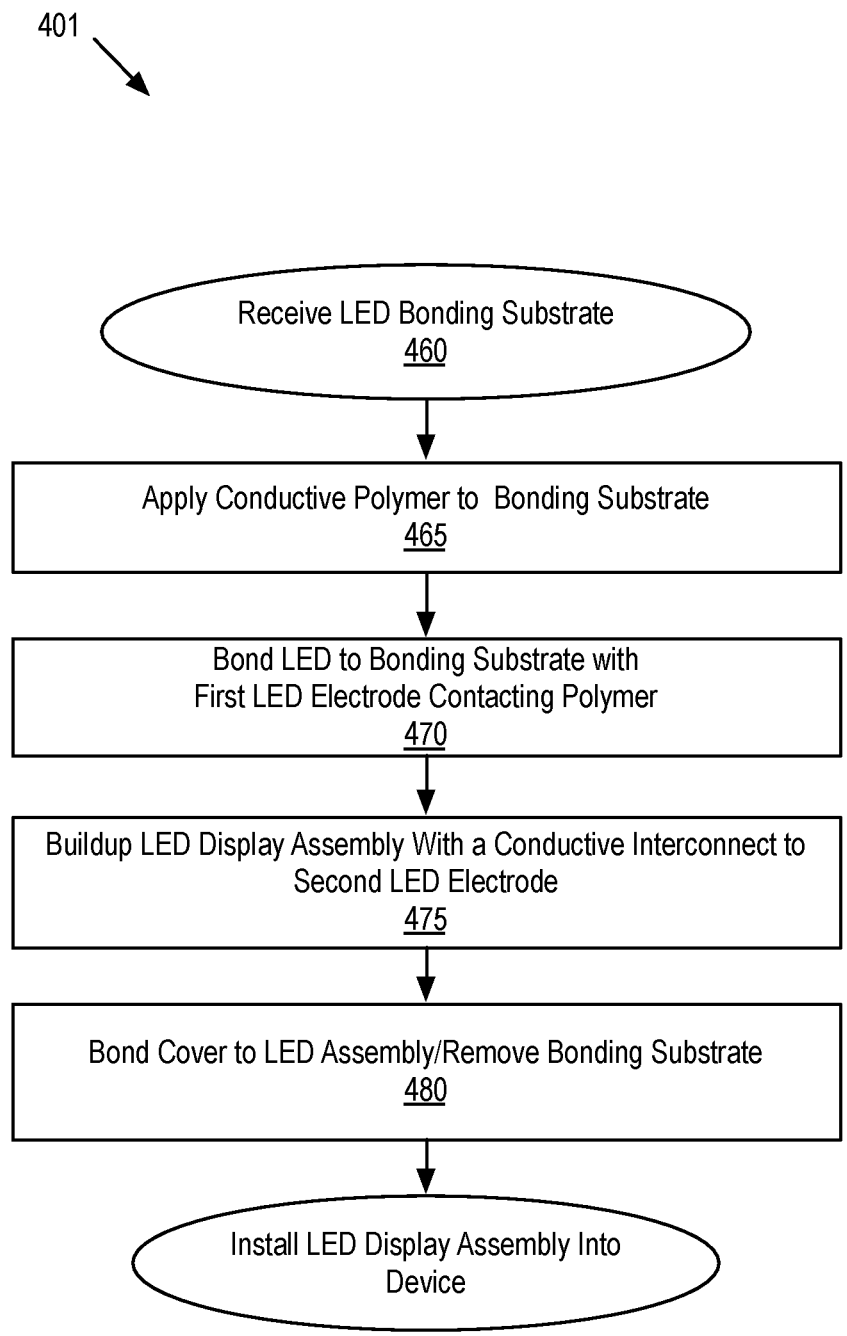
FIG. 4 is a flow diagram illustrating a method of assembling crystalline LED elements into a display, in accordance with embodiments.

FIG. 4 is a flow diagram illustrating a method 401 of assembling crystalline LED elements into a display assembly, in accordance with embodiments. The LED elements utilized in method 401 may be picked up and/or transferred from an LED bonding source substrate, such as LED bonding source substrate 250 (FIG. 2K) or LED bonding source substrate 350 (FIG. 3E). FIGS. 5A, 5B, 5C, 5D and 5E are cross-sectional views of an exemplary crystalline LED element assembled into a display as illustrative operations of the method 401 are performed, in accordance with embodiments.

Figure 5A:
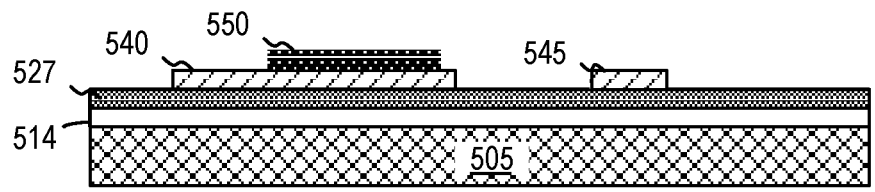
FIGS. 5A, 5B, 5C, 5D, and 5E are cross-sectional views of an exemplary crystalline LED element assembled into a display as illustrative operations of the method illustrated in FIG. 4 are performed, in accordance with embodiments.

Referring to FIG. 4, method 401 begins at operation 460 where an LED bonding substrate is received. The bonding substrate 505 can be either the display substrate or a temporary substrate for building up the display. FIG. 5A further illustrates a temporary substrate embodiment. The bonding substrate 505 is covered with a release layer 514, which may be any dielectric (e.g., adhesive polymers). After build-up, the LED display assembly may be removed at the release layer 514 and the bonding substrate 505 then reused after release. Bonding substrate 505 may therefore be of any substrate material known in the art to be suitable for build-up that has sufficient flatness for the LED bonding process employed and has a sufficiently large area (e.g., large format) to accommodate the desired display area. An exemplary bonding substrate material is glass. The exemplary embodiment illustrated in FIG. 5A further includes a dielectric protection layer 527, which is to protect the LED display assembly after build up and release. Exemplary protection layer materials include SiON, SiN, and CDN. In alternate embodiments, dielectric protection layer 527 is not employed.

Disposed over the bonding substrate is a display backplane interface having first backplane metal interconnects that are to interface a first LED electrode with a display backplane (e.g., driving circuitry, access transistors, and/or discrete electronics, etc.). In the exemplary embodiment illustrated in FIG. 5A, first backplane metal interconnects 540 are pads arrayed over bonding substrate 505. For an exemplary embodiment where the LED display is to include an array of 5 μm×5 μm LED elements, first backplane metal interconnects 540 may be 10 μm metal pads having a pitch of around 25 μm. Second backplane interconnects 545 are also metal pads arrayed (e.g., with a similar pitch, but smaller pad size) over bonding substrate 505. Second backplane interconnects 545 are electrically coupled to the second LED electrode, and so are to be electrically isolated from first backplane metal interconnects 540. First and second backplane metal interconnects 540, 545 may be received as features of bonding substrate starting material (i.e., fabricated upstream of method 401), or deposited and patterned as part of the LED display assembly build up (e.g., using any known metal deposition process to deposit any known interconnect metallization).

Returning to FIG. 4, method 401 continues at operation 465 where a conductive polymer is applied to regions of the bonding substrate. The conductive polymer is to affix an LED element to the bonding substrate while the LED display assembly is built up around the LED element, and to electrically connect one of the backplane metal interconnects to a metal electrode on a first/back side of the LED element. In one advantageous embodiment, the conductive polymer is a photosensitive conductive film (e.g., a conductive photoresist). An example of such material is a base photoresist (e.g., SU-8 25) doped with a conductive polymer (e.g., polyaniline). Some conductive photoresist formulations have been described in technical literature as having a resistivity in the range of 1 ohm-cm. At this resistivity, parasitic electrical resistance attributable to the conductive polymer of around 0.5 μm thick, employed in accordance with embodiments herein is expected to be in the range of ~200 ohms for a 5 μm×5 μm LED element. This is still much smaller than typical (p-type) contact resistance (e.g., >2 kohm) for an element of this size.

The conductive polymer may be spin-coated over the bonding substrate, and as illustrated in FIG. 5A, patterned into conductive polymer elements 550 located on the first backplane metal interconnects 540. Patterning and alignment of the conductive polymer elements is non-critical as for a 10 μm metal interconnect pad, the conducting polymer element may have a lateral dimension of 10-15 μm on a 25 μm pitch. Conductive photoresist embodiments may be advantageously optically delineated with a straightforward lithographic exposure/develop process. Non-photosensitive conductive polymer embodiments may further rely on a lithographic masking process and subsequent etch/solvent dissolution process to pattern the conductive polymer into elements.

Returning to FIG. 4, method 401 continues at operation 470 where a plurality of LED elements is affixed to the conductive polymer. More specifically, a first metal LED electrode of each LED element is placed in electrical contact with the conductive polymer. The conductive polymer is to couple the first metal LED electrode to the display backplane metal interconnect. In the exemplary embodiment illustrated in FIG. 5B, LED element 230 is applied with a first metal LED electrode 210 in direct contact with conductive polymer element 550. Alignment between LED element 230 and conducting polymer element 550 is non-critical and the LED element 230 may be transferred from a LED crystalline LED bonding source substrate using any transfer printing/pick-and-place bonding technique. For example, a plurality of LED elements may be picked up from a source substrate with a print stamp or a pick-and-place head with metal LED electrode 225 facing the stamp/head. The metal electrode 210 for each of the plurality of elements is then put in contact with the conductive polymer and the pick-and-place head separated from the plurality of LED elements. In one advantageous embodiment, room temperature compression bonding is employed to affix first metal LED electrode(s) 210 to the conductive polymer element 550. In a further embodiment, the room temperature bond is utilized for an initial bond, which is followed with a high temperature (e.g., 140-180° C.) curing, and/or UV curing of the conductive polymer.

Figure 5B:
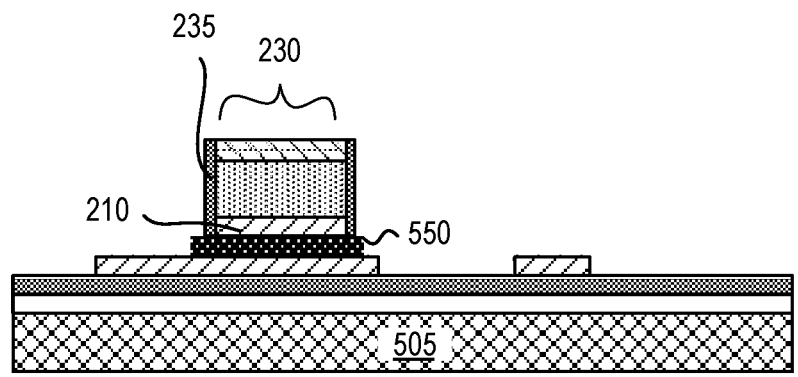
Figure 5C:
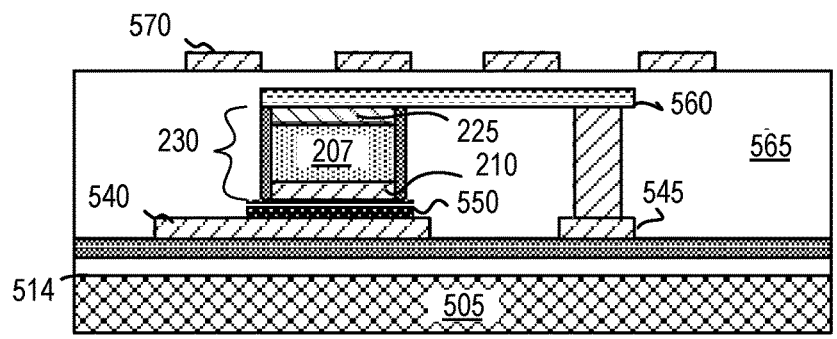

FIGS. 5A and 5B illustrate an exemplary embodiment where conductive polymer is patterned into the plurality of separate conductive polymer elements 550 prior to affixing the plurality of LED elements 230 to the conductive polymer. However, in alternative embodiments patterning of the conductive polymer is performed subsequent to bonding of the LED element 230. For example, a flood exposure may be utilized to remove all conductive polymer not bonding an LED element in a self-aligned manner. For non-photosensitive conductive polymer embodiments, a self-aligned conductive polymer etch/solvent dissolution may be performed after the LED elements are affixed to the conductive polymer.

Returning to FIG. 4, method 401 continues at operation 475 where the LED display assembly is built up with at least a conductive interconnect electrically coupling to a second metal LED electrode. In advantageous embodiments, where the second metal LED electrode is disposed over a light emitting surface of the LED element, at least a portion of the conductive interconnect also disposed over the light emitting surface of the LED element is optically transmissive within the emission band of the LED element. In one exemplary embodiment illustrated in FIG. 5C, the conductive interconnect 560 contacting Metal LED electrode 225 is ITO. The optically transmissive interconnect then electrically coupled, for example through any conventional build-up interconnect technique to second backplane metal interconnect 545. The LED element 230 and interconnect metallization is encapsulated in build-up dielectric 265, which may be any known material, such as but not limited to thermosetting epoxy resin and/or build-up dielectric films (e.g., Ajinomoto Build-up Film, etc.). In further embodiments, the LED display assembly further includes a touch sensor layer, including for example metallization for a capacitive, inductive, optical, or other known touch sensor network. As further illustrated in FIG. 5C, a touch sensor layer 570 is disposed over build up dielectric 265 encapsulating LED element 230.

Figure 5D:
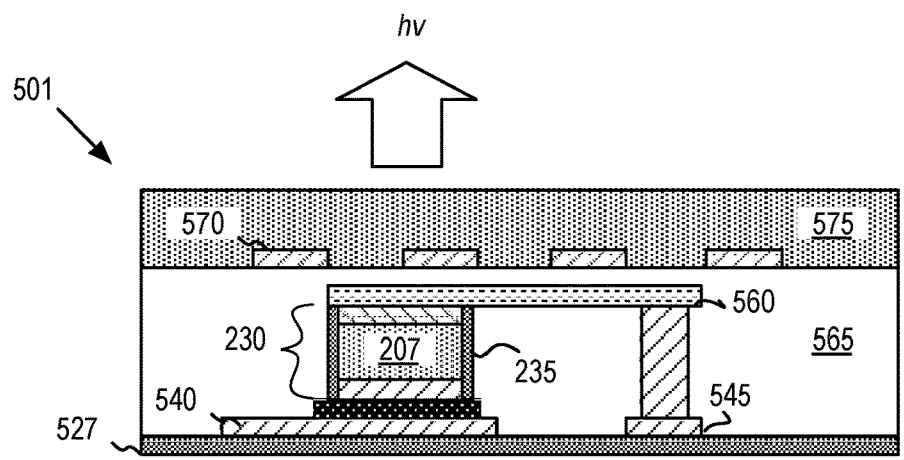
Figure 5E:
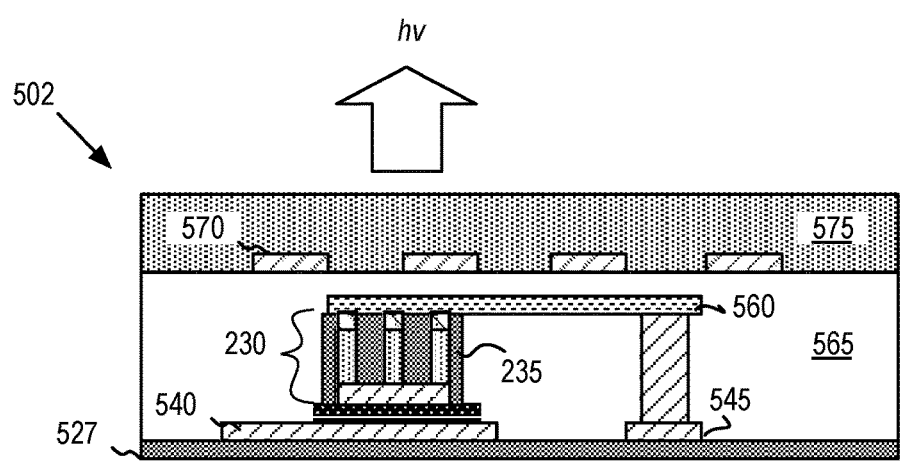

Returning to FIG. 4, method 401 continues at operation 480 where a display cover is affixed to the LED assembly and the bonding substrate is removed from the display assembly. In the exemplary embodiment illustrated in FIG. 5D, display cover 575 is disposed over touch sensor layer 570 and may be any material that is optically transmissive within an emission band of the LED elements, such as but not limited to glass, or sapphire (aluminum oxide $Al_2O_3$). Depending on a thickness of display cover 575, the LED display assembly 501 may be flexible or rigid upon removal of the bonding substrate 505. For example where display cover 575 is on the order of a few tens of microns, the LED display assembly 502 may be flexible with the radii of curvature being primarily a function of cover thickness. With display cover 575 providing structural support for the LED display assembly 501, bonding substrate 505 may be separated from build-up dielectric 565 with the build-up retaining the display backplane interface (e.g., metal interconnects 540, 545) and the plurality of LED elements 230. For example, a laser liftoff/debonding process may be employed to induce separation at the interface of release layer 514 and protection layer 527. Method 401 is then substantially complete with the LED display assembly now having many hundreds of thousands or millions of the LED elements arranged substantially as depicted in FIG. 5D. The display assembly is then ready for installation/integration into an electronic device (e.g., mobile computing platform/handset). FIG. 5E illustrates an alternate embodiment where the method 401 utilizes the source substrate 350 to form LED display assembly 502 substantially as described above in the context of LED display assembly 501.

Figure 6:
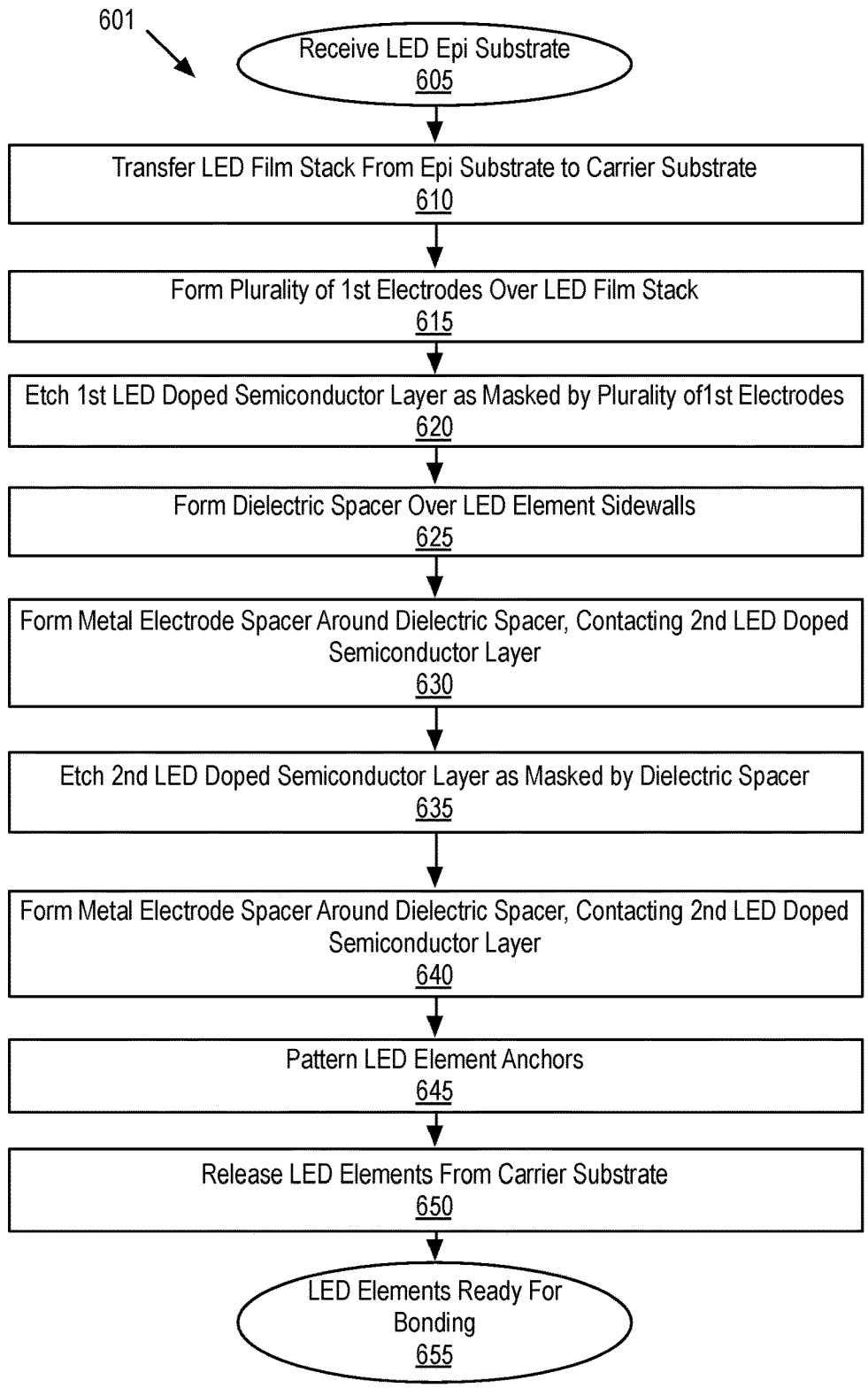
FIG. 6 is a flow illustrating a method of fabricating crystalline LED elements suitable for assembly into a display, in accordance with alternative embodiments.

FIG. 6 is a flow illustrating a method 602 of fabricating a crystalline LED bonding source substrate, in accordance with alternative embodiments. Method 602 is an alternative to method 101 (FIG. 1) for fabricating an LED source substrate, from which LED elements may be transferred to assemble a crystalline LED display assembly. While method 101 provides LED elements with opposing two sided metal LED electrodes (front and back of LED element), method 601 provides LED elements with single-sided metal LED electrodes (front or back of LED element). Self-aligned patterning techniques are employed to maintain a small LED element footprint with minimal critical patterning/overlay requirements.

Method 601 comprises wafer-level processing suitable for generating the LED source substrate from a semiconductor LED film stack received at operation 605. The semiconductor LED film stack may be a contiguous film covering an epitaxial substrate to form a monolithic body (e.g., an LED epi wafer). Generally, any known semiconductor LED film stack may be utilized. In the exemplary embodiment illustrated in FIG. 7A, epi wafer 701 includes an epitaxial substrate 205, a buffer layer 206 and a semiconductor LED film stack 707 including at least a first doped semiconductor region 706, and a second complementarily doped semiconductor region 708 epitaxially grown on buffer layer 206. In embodiments, the LED film stack 707 includes one or more semiconductor heterojunction, for example forming a quantum well, etc. In the exemplary embodiment, first doped semiconductor region 706 is an n-type doped layer and semiconductor region 708 is a p-type doped layer completing the diodic stack architecture. In specific embodiments, semiconductor LED film stack 707 is a heteroepitaxial III-N semiconductor film stack, for example comprising GaN and/or alloys thereof, such as InGaN. However, the specific composition of semiconductor LED film stack 707 is dependent on the desired emission band, and embodiments herein are not limited in that respect.

Figure 7A:
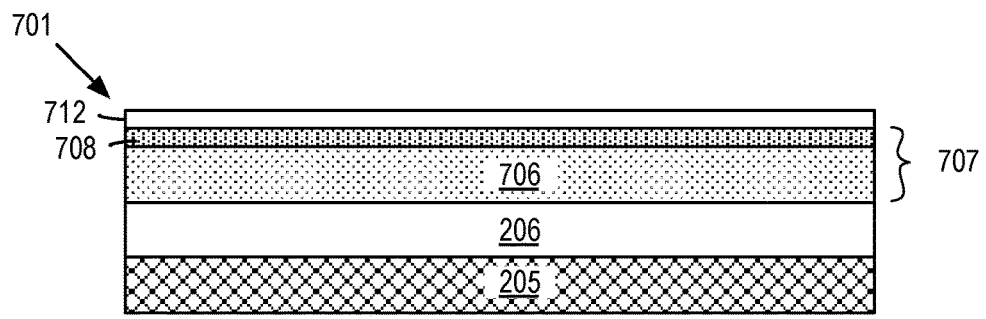
FIGS. 7A, 7B, 7C, 7D, 7E, and 7F are cross-sectional views of exemplary crystalline LED elements as illustrative operations of the method illustrated in FIG. 6 are performed, in accordance with embodiments.

As described above, epitaxial substrate 205 may be any know substrate suitable for growing an LED semiconductor film stack. For example, substrate 205 may be a variety of materials, including, but not limited to, silicon, germanium, SiGe, III-V compounds like GaAs, InP, III-N compounds like GaN, 3C—SiC, and sapphire to name a few. Buffer layer(s) 206 may be of any known architecture suitable for transitioning from the composition and microstructure of epitaxial substrate 205 to that of LED film stack 207. As also illustrated in FIG. 7A, a bonding material layer 712, for example a dielectric such $SiO_x$, may be further deposited over doped semiconductor layer 708.

Returning to FIG. 6, method 601 continues at operation 610 where the LED film stack is transferred to a carrier substrate. The wafer-level film transfer operation 610 may not be needed if the LED epi substrate received at operation

Figure 7B:
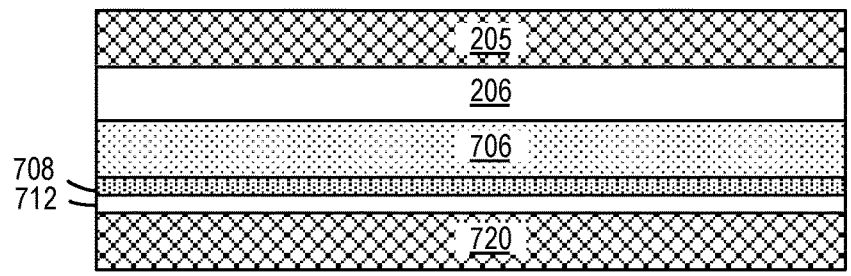
Figure 7C:
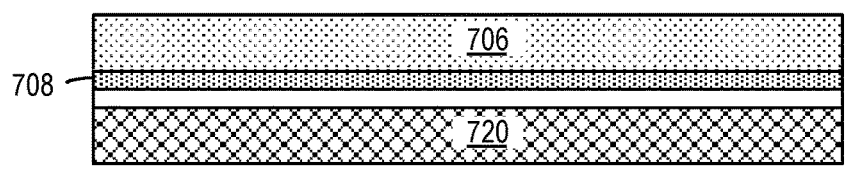

605 is a suitable support for the LED bonding source substrate. For example, if the epitaxial substrate received at operation 605 already includes an LED semiconductor film stack of the correct layer sequence (e.g., n-type doped layer over p-type doped layer) over a suitably flat carrier (e.g., a silicon wafer) that can be subsequently decoupled from the LED elements fabricated in the film stack (e.g., includes a release layer). For the exemplary embodiment where a film transfer is advantageous, the LED semiconductor stack may be coupled to a carrier at operation 610 following any technique known in the art. In one embodiment, the coupling is long-term stable, for example using any (thermal) compression bonding between LED film and the carrier. In another embodiment, the coupling is shorter term, for example using a temporary adhesive polymer and/or electrostatic coupling between the carrier and LED film-electrode stack. Likewise, at operation 610 any technique known in the art may be utilized to decouple the LED film stack from the epitaxial substrate. For example a laser liftoff or CMP/grind and clean may be utilized to remove the epitaxial substrate. In the exemplary embodiment illustrated in FIG. 7B, bonding material layer 712 is compression bonded with a bonding material layer (e.g., $SiO_x$) present on carrier 720. The epitaxial substrate is then removed exposing the complementary doped LED semiconductor region or layer 706, as further illustrated in FIG. 7C.

Figure 7D:
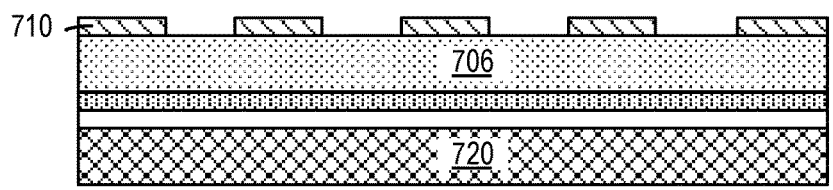

Returning to FIG. 6, method 601 continues at operation 615 where an electrode metal is deposited over the LED film stack. The composition of the electrode metal may vary as a function of the LED film stack, for example to provide a desired metal work function suitable for providing an ohmic contact, tunneling contact, etc. In one exemplary embodiment, the metal deposited at operation 615 is an n-type metal suitable for making contact to an n-type doped semiconductor layer. In some embodiments an n-type contact metal form an electrode stack with a bulk material deposited on the contact metal. Any known deposition technique, such as but not limited to PVD, CVD, electrolytic, or electroless plating may be utilized at operation 615. As further illustrated in FIG. 7D, an n-type metal film is deposited over a n-type doped semiconductor layer 706 and patterned into a plurality of first metal LED electrodes 710 arrayed over the LED film stack. Any known lithographic patterning and masked etching process or masked plating process may be employed at operation 615. In one exemplary embodiment, operation 615 entails Cu plating electrodes 710.

Returning to FIG. 6, method 601 continues at operation 620 where a plurality of LED elements or formed by etching trenches into the LED semiconductor film stack. The trench etching stops on the buried second doped semiconductor region. The etching may be masked with the same pattern utilized to etch the first metal LED electrodes (e.g., the trench etch follows the electrode etch without removal of the photoresist that defines the electrodes) and/or the first metal LED electrodes may be utilized as masking for the trench etch. The trenches delineating an LED element are therefor self-aligned to the first metal LED electrode. The light emitting surface area of an LED element can therefore be approximately equal to the area of the first metal LED electrode. Following the trench etching operation 620, a dielectric spacer is formed around the first metal LED electrodes and the sidewall of the first doped semiconductor region at operation 625. Any known dielectric material, such as but not limited to $SiO_x$, SiON, SiN, CDO, and CDN may be conformally deposited over the LED elements. An anisotropic etch is then performed using any anisotropic etch process known in the art for the chosen dielectric material.

Figure 7E:
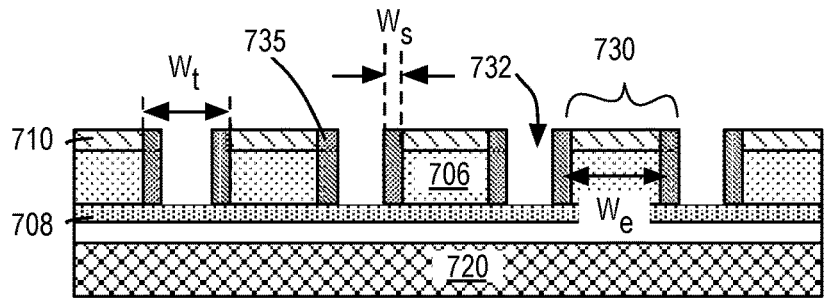

FIG. 7E is a cross-sectional view of crystalline LED elements 730 following their delineation at operation 620 and encapsulation by dielectric spacer at operation 625. In exemplary embodiments, the lateral element width $W_e$ of the LED elements is patterned to be no more than 5 µm. As further depicted, spacer dielectric 735 (e.g., CDN) serves as a self-aligned sidewall dielectric coating to the LED elements 730. In advantageous embodiments, the thickness of the dielectric material utilized for spacer formation is selected to ensure dielectric spacer 735 has a lateral thickness, or width $W_s$ that is less than half the nominal lateral width $W_t$ of the trenches 732 etched into the LED film stack at operation 620 (FIG. 6). In exemplary embodiments, $W_s$ is less than 0.1 µm. The spacer width then ensures two dielectric spacers on adjacent LED elements leave a portion of doped semiconductor region 708 exposed at the bottom of trench 732.

Returning to FIG. 6, method 601 continues at operation 630 where a second metal LED electrode film is deposited in contact with the second doped semiconductor region of the LED film stack exposed between adjacent LED elements. The metal electrode film is blanket deposited over the LED elements with a conformal deposition process to ensure the metal electrode film follows the spacer dielectric sidewall. The composition of the second electrode metal may vary as a function of the LED film stack, for example to provide a desired metal work function suitable for providing an ohmic contact, tunneling contact, etc. In one exemplary embodiment, the metal deposited at operation 630 is a p-type metal suitable for making contact to p-type doped semiconductor layer. In further embodiments, a p-type metal may be one material in a multi-metal stack. In one embodiment, p-type metal is aluminum (Al), in another embodiment p-type metal is gold (Au) over a layer of nickel (Ni). Any known deposition technique of suitable conformality, such as but not limited to CVD and ALD electrolytic, or electroless plating may be utilized at operation 630.

The second electrode metal film is then blanket etched anisotropically to at least partially self-align a Metal LED electrode spacer with the dielectric spacer formed at operation 625. In the exemplary embodiment, a metal LED electrode film is etched with no additional lithographic mask to form a fully self-aligned metal electrode spacer adjacent to the dielectric spacer. The anisotropic etch process may be any known for the particular p-type metal(s) utilized. For example, both Al and Au can be etched with a chlorine-based dry etch process while leaving Cu electrode 710 and a SiN spacer dielectric 735 unetched. The self-aligned metal electrode formed at operation 625 maintains contact (e.g., p-contact) to the second doped semiconductor region of the LED stack. In advantageous embodiments where the self-aligned metal electrode has a lateral width less than half the trench width between two adjacent dielectric sidewall spacers, delineation of the LED elements may be completed by continuing the trench etch through the second doped semiconductor layer with an etch that is self-aligned to the second metal LED electrode.

Figure 7F:
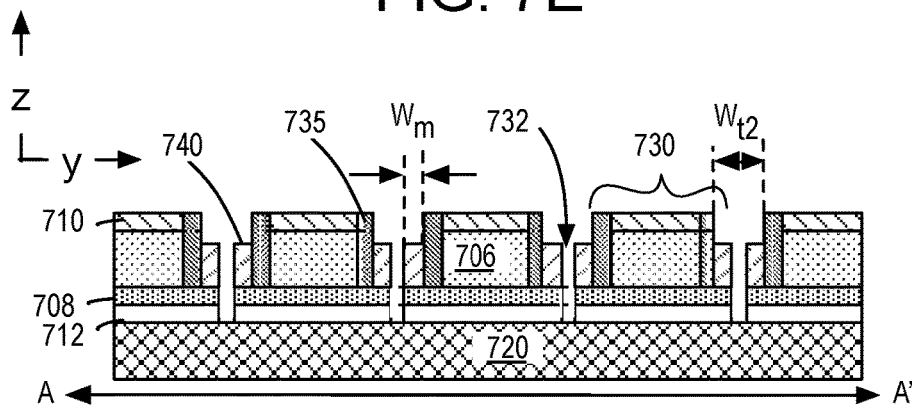
Figure 7G:
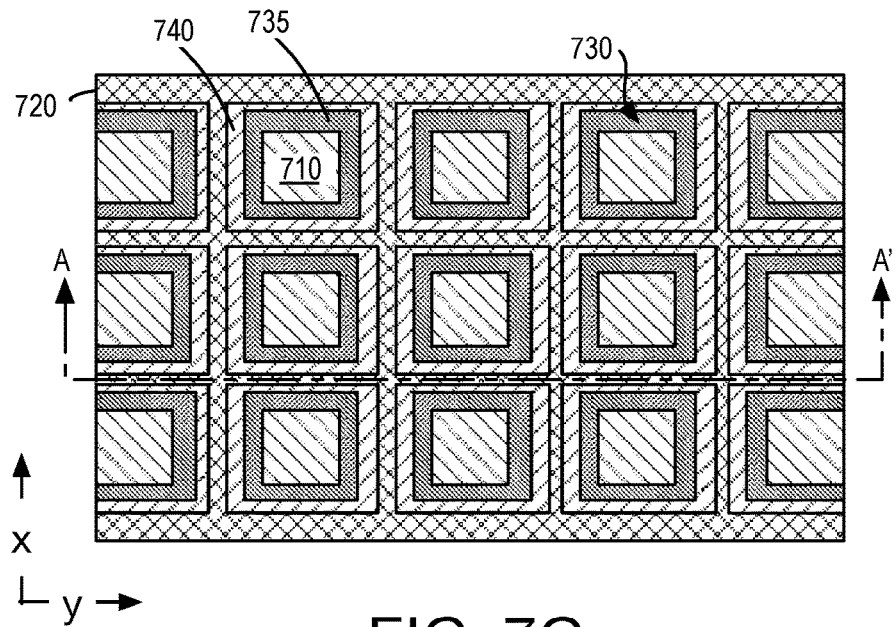
FIG. 7G is a plan view of the crystalline LED elements depicted in FIG. 7F, in accordance with embodiments.

In the exemplary embodiment illustrated in FIG. 7F, anisotropic etching of a p-type metal film forms a metal electrode 740 surrounding a perimeter of the metal electrode 710. Metal electrode 740 is self-aligned, to and in contact with, dielectric sidewall 735. Following the unmasked anisotropic etch of the metal electrode film, metal electrode 740 is recessed to a z-height lower than Metal LED electrode 710. Dielectric sidewall spacer 735 separates the two electrodes 710, 740. In advantageous embodiments, the thickness of the metal electrode material utilized for the self-aligned p-contact is selected to ensure metal electrode 740 has a lateral thickness, or width $W_m$ that is less than half the nominal lateral width $W_{t2}$ of the trenches 732 remaining after two thicknesses of the spacer dielectric 735 fill in a portion of the trench etched into the LED film stack at operation 620 (FIG. 6). The metal electrode width then ensures the two self-aligned metal electrodes on adjacent LED elements leave a portion of doped semiconductor region 708 exposed at the bottom of trench 732. Self-aligned portions of metal electrode 740 may for example have a lateral width $W_m$ less than and 0.1 μm, and advantageously only a few hundred nanometers. The trench etch then clears the doped semiconductor region 708 and may advantageously further etch through at least a partial thickness of release layer 712. In the illustrated embodiment, an anisotropic etch through release layer 712 stops on carrier 720. FIG. 7G is a plan view of the crystalline LED elements depicted in FIG. 7F, in accordance with embodiments. LED elements 730 are rectangular (e.g., square) in the exemplary embodiment illustrated in FIG. 7G. However, an LED element 730 may have an alternative shape (e.g., a circular footprint). FIG. 7G further illustrates how metal LED electrode 740 forms a perimeter contact surrounding metal electrode 710 with dielectric spacer 735 disposed there between.

Figure 7H:
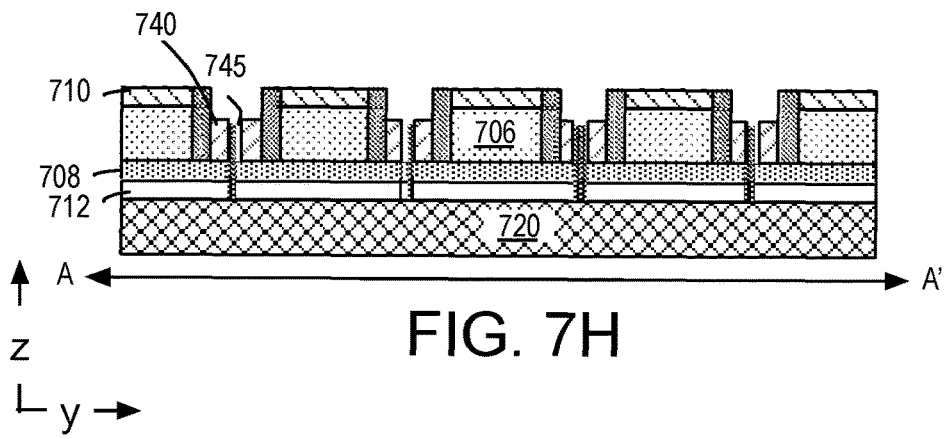
FIG. 7H is a cross-sectional view of exemplary crystalline LED elements as an illustrative operation of the method illustrated in FIG. 6 is performed, in accordance with embodiments.
Figure 7I:
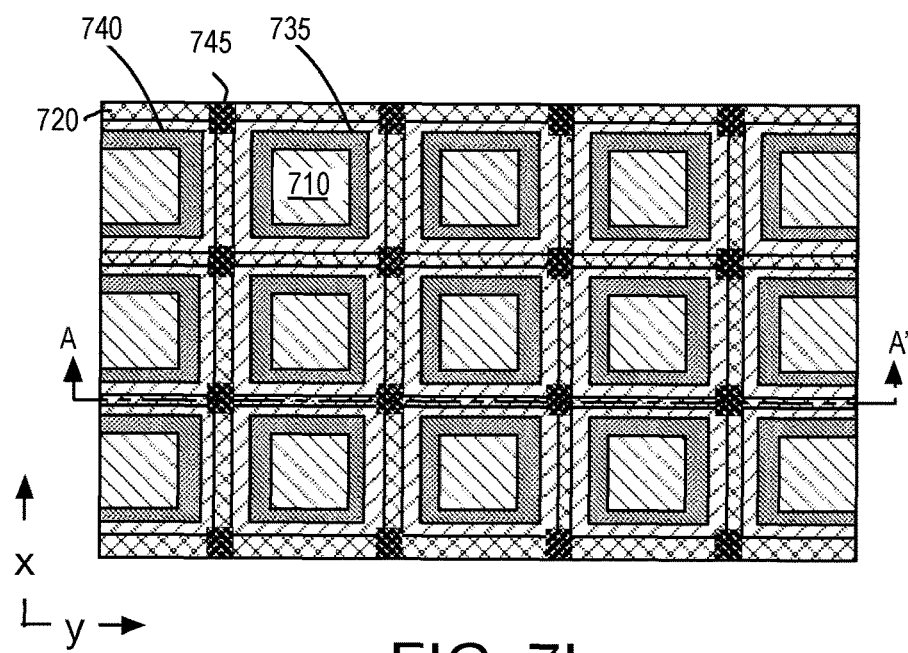
FIG. 7I is a plan view of the crystalline LED elements depicted in FIG. 7H, in accordance with embodiments.

Returning to FIG. 6, method 601 continues at operation 645 where LED element anchors are formed within the trenches separating adjacent LED elements. Anchors are patterned in preparation for a controlled release of the LED elements from the carrier. The LED element anchors are formed within the trenches etched at operations 620 and 635, intersecting portions of the LED element sidewalls while still leaving access for a release agent to undercut the LED elements. As further illustrated in FIG. 7H, anchor material is then deposited into the trenches between adjacent LED elements, filling at least the recessed release layer and a portion of the trench lined by metal LED electrode 740. Anchor material may be back filled into trenches 732, planarizing with a top surface of LED elements 730, for example with a spin-on process. The planarized anchor material may then be patterned into a plurality of separate anchors 745. In one advantageous embodiment, the anchor material is a photosensitive polymeric material (e.g., photoresist) spin-coated into trenches 732. The photoresist is then lithographically patterned (i.e., exposed and developed) into separate LED element anchors 745 filling the trench and maintaining separation between adjacent LED elements 730 as further illustrated in FIG. 7I, which is a plan view of the crystalline LED elements 730 depicted in FIG. 7H, in accordance with embodiments.

Figure 7J:
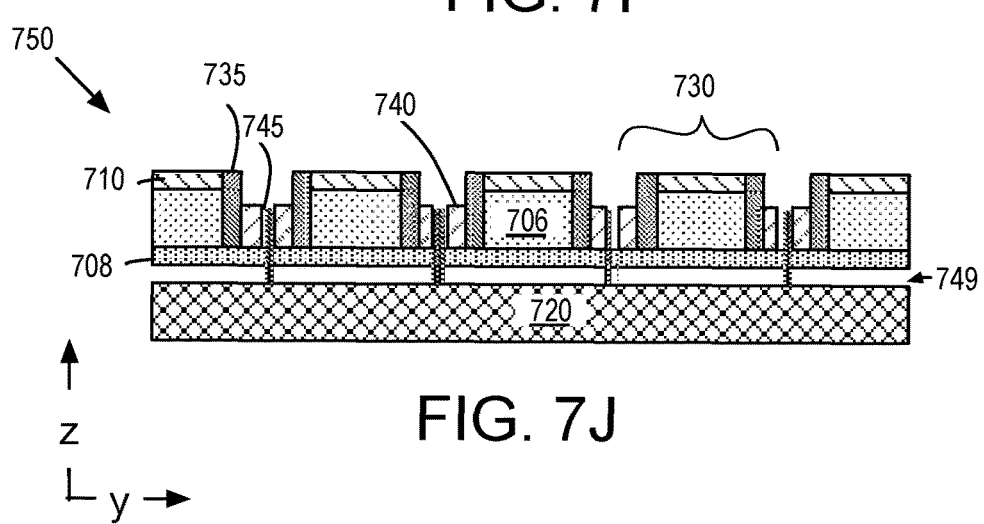
FIG. 7J is a cross-sectional view of exemplary crystalline LED elements following completion of the method illustrated in FIG. 6, in accordance with embodiments.

Returning to FIG. 6, method 601 continues at operation 650 where the anchored LED elements are controllably released from the carrier. After release operation 650, the LED elements remain affixed to the carrier only by the anchors formed at operation 645. In embodiments, LED elements are released from carrier by laterally etching a release layer disposed between the LED elements and the carrier. FIG. 7J is a cross-sectional view of a crystalline LED bonding source substrate 750 following completion of method 601, in accordance with embodiments. As shown, a source LED bonding/release layer 712 is laterally etched, for example with any isotropic dry or wet chemical etchant (e.g., HF), undercutting the plurality of crystalline LED elements 730. Anchors 745 landing on carrier 720 are then surrounded by a free-space void 749 extending over the entire lateral area or footprint of each LED element 730. In the exemplary embodiments where a photosensitive polymer is employed for the anchor material, each anchor 745 is a polymer pillar contacting the metal electrode 740 of at least two adjacent LED elements 730 (e.g., four nearest LED elements 730 are connected by each anchor 745). In some embodiments, anchors 745 may be placed on edges or selected pairs of corners of LED 730. Method 601 is then substantially complete with the LED elements ready for transfer/bonding to an LED display assembly.

Figure 8A:
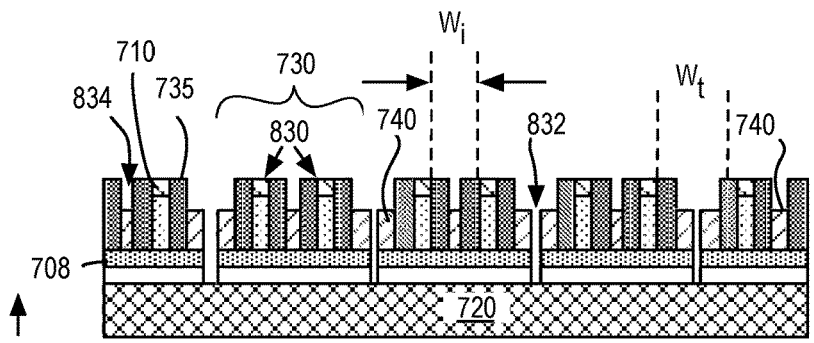
FIG. 8A is a cross-sectional view of exemplary crystalline LED elements as an illustrative operation of the method illustrated in FIG. 6 is performed in accordance with alternative embodiments.
Figure 8B:
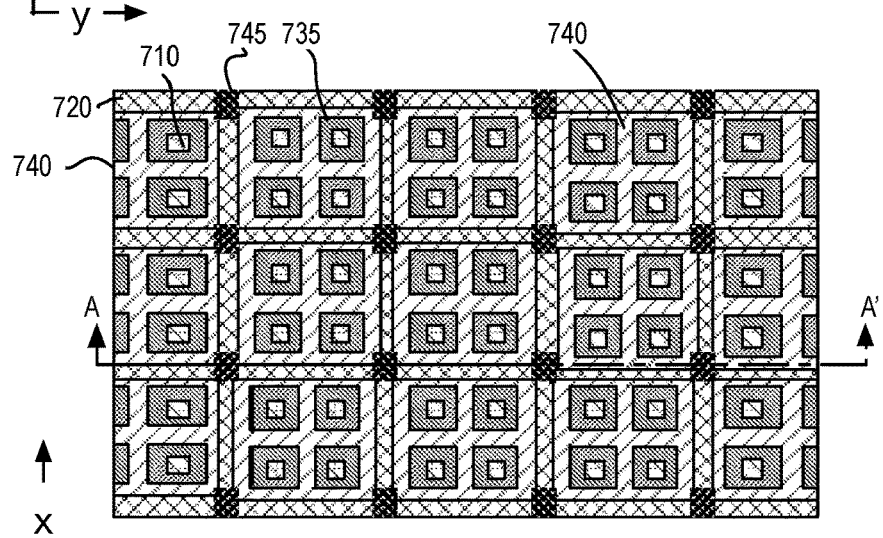
FIG. 8B is a plan view of the crystalline LED elements depicted in FIG. 8A, in accordance with embodiments.
Figure 8C:
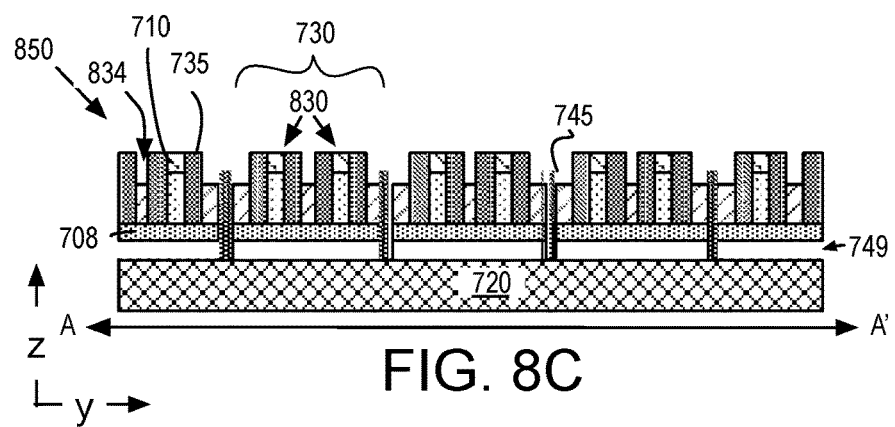
FIG. 8C is a cross-sectional view of exemplary crystalline LED elements following completion of the method illustrated in FIG. 6, in accordance with alternative embodiments.

FIG. 8A is a cross-sectional view of exemplary crystalline LED elements as an illustrative operation of the method 601 is performed in accordance with alternative embodiments where each LED element is split into a plurality of LEDs. FIG. 8B is a plan view of the crystalline LED elements depicted in FIG. 8A. FIG. 8C is a cross-sectional view of exemplary crystalline LED elements following completion of the method 601 in accordance with alternative embodiments where each LED element is split into a plurality of LEDs.

FIG. 8A illustrates an inter-element trench delineating separate LED elements. The inter-element trench may be formed subsequent to forming an intra-element trench 834 delineating redundant LEDs within each LED element 730. The etch mask (not depicted) utilized at operation 620 may further define the locations of intra-element trenches 834 separating adjacent LEDs, along with the inter-element trenches 832. Intra-element trenches 834 may define LED pillars with a lateral CD in the sub-micron regime, for example. The intra-element trench etch is stopped before clearing the LED film stack, for example stopped on the (p-type) doped semiconductor layer 708. Dielectric spacer 735 and self-aligned metal LED electrode 740 are formed as described above. In advantageous embodiments where intra-element trenches 834 have a lateral width $W_i$ that is greater than twice the lateral width $W_s$ of sidewall dielectric spacers 735, metal electrode 740 backfills intra-element trenches 834 if its thickness is greater than half of the remaining space in trenches 834 between the dielectric spacers 725 in the trenches. Inter-element trenches 832 are not completely backfilled with self-aligned spacer dielectric, or self-aligned electrode metal. Therefore, bonding/release material layer 712 may be recessed and LED element anchors formed substantially as described above and as further depicted in FIGS. 8B and 8C. As shown in FIG. 8C, crystalline LED bonding source substrate 850 has many of the structural features described above for crystalline LED bonding source substrate 750, with the addition of redundant LEDs 830 in each element 730. Method 601 is again substantially complete with the LED elements of the LED bonding source substrate 850 ready for pickup/bonding to an LED display assembly. The advantages of redundant LEDs 830 and procedure for repair of redundant LED 830 is substantially the same as described above for redundant LED 330.

Figure 9:
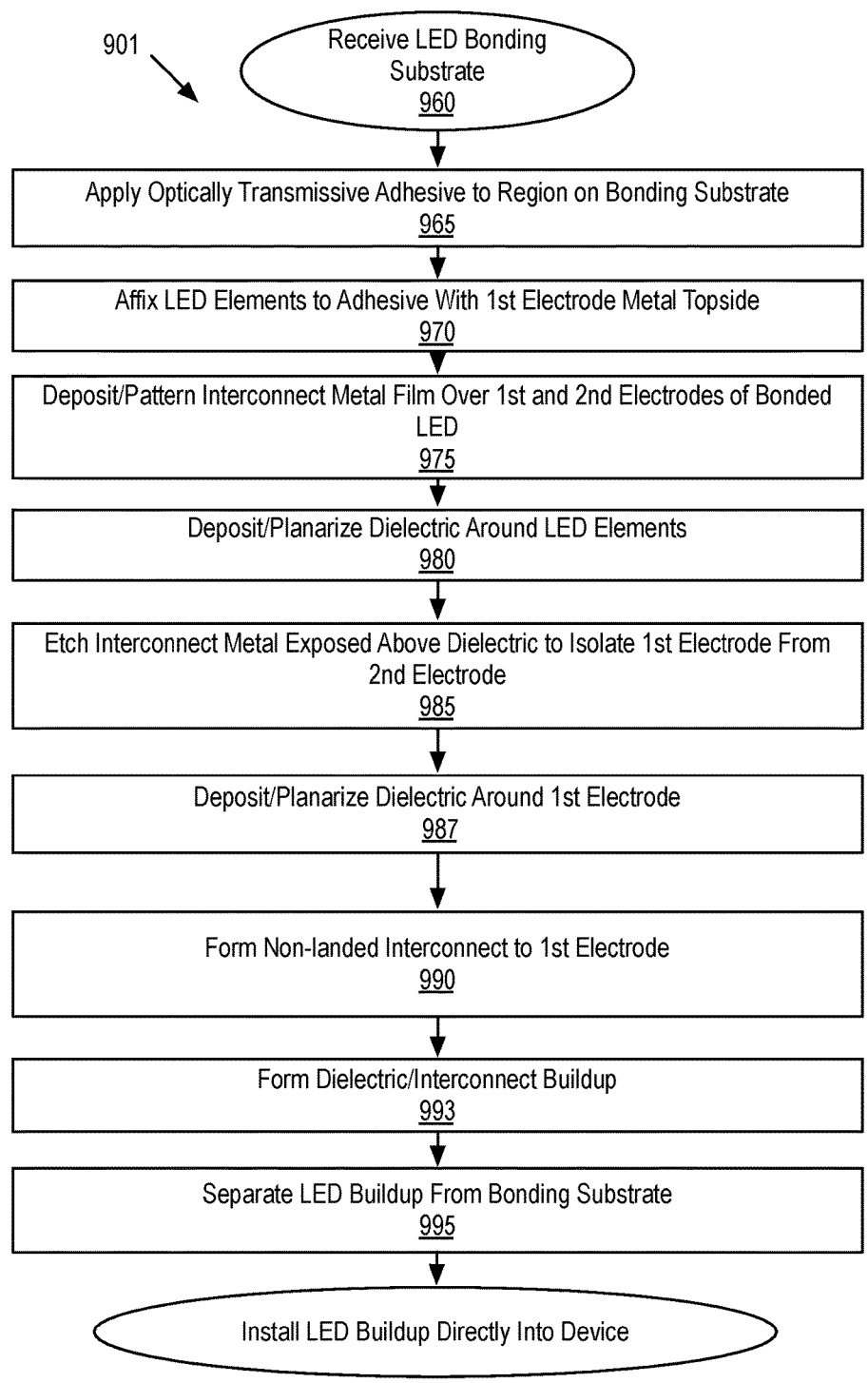
FIG. 9 is flow diagram illustrating a method of assembling crystalline LED elements into a display, in accordance with alternative embodiments.

FIG. 9 is flow diagram illustrating a method 901 of assembling crystalline LED elements into a display, in accordance with alternative embodiments. The LED elements utilized in method 901 may be picked up and/or transferred from certain LED bonding source substrate, such as LED bonding source substrate 750 (FIG. 7J) or LED bonding source substrate 850 (FIG. 8C). FIG. 10A-10G are cross-sectional views of exemplary crystalline LED elements assembled into a display as illustrative operations of the method 901 are performed, in accordance with embodiments.

Referring to FIG. 9, method 901 begins at operation 960 where an LED bonding substrate is received. At operation 965 an optically transmissive adhesive is applied to the bonding substrate. As further illustrated in FIG. 10A, a bonding substrate 1005 is covered with a release layer 1014, which may be any dielectric (e.g., $SiO_x$). Bonding substrate 1005 functions as a temporary support upon which the LED display assembly is built up. After build-up, the LED display assembly may be removed at the release layer 1014 and the bonding substrate 1005 then reused after release. Bonding substrate 1005 may therefore be of any substrate material known in the art to be suitable for build-up that has sufficient flatness for the LED transfer process employed and is of sufficient surface area (e.g., large format) for the desired display area. One exemplary bonding substrate material is glass.

Figure 10A:
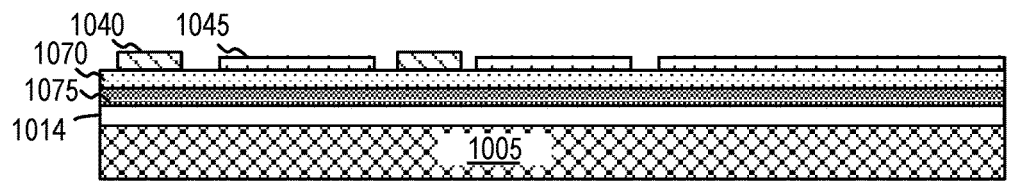
FIGS. 10A, 10B, 10C, 10D, 10E, 10F, and 10G are cross-sectional views of exemplary crystalline LED elements assembled into a display as illustrative operations of the method illustrated in FIG. 9 are performed, in accordance with embodiments.

In embodiments, a cover is disposed over the release layer of the bonding substrate. The cover is to serve as the LED display cover after the display assembly is separated from the bonding substrate. FIG. 10A illustrates an exemplary cover layer 1075 and may be of any material known to be suitable for display cover applications, such as but not limited to, glass and sapphire ($Al_2O_3$). In further embodiments, and as also illustrated in FIG. 10A, bonding substrate 1005 further includes a touch sensor layer 1070 and may include one or more patterned material layers compatible with any known capacitive, inductive, or optical touch technologies, for example.

In embodiments, metal cover-side interconnects are disposed over the bonding substrate. The metal cover-side interconnects may be metal pads and/or wires that are to provide an interconnect to a metal LED electrode. In the exemplary embodiment illustrated in FIG. 10A, metal cover-side interconnects 1040 are pads of a given lateral dimension (e.g., 1 µm) arrayed over bonding substrate 1005 at a given pitch (e.g., 25 µm) to accommodate an LED element between adjacent metal cover-side interconnects 1040.

In the embodiment further illustrated in FIG. 10A, an optically transmissive adhesive 1045 is applied to regions over the bonding substrate 1005 (e.g., arrayed at a pitch comparable to that of cover-side interconnects 1040). Any technique may be utilized to apply the adhesive and the adhesive material may be any commercially available product known as embodiments are not limited in this respect.

Returning to FIG. 9, method 901 continues at operation 970 where LED elements are affixed to the bonding substrate. Compression bonding and/or thermal/UV bonding/cure techniques may be utilized to affix the LED elements to the adhesive regions, for example. LED elements may be transferred from a LED bonding source substrate by picking up a plurality of the LED elements from a source substrate (e.g., source substrate 750 or 850) with a transfer print/pick-and-place head, or the like. For one exemplary embodiment, the metal LED electrodes will be facing the print head and a doped semiconductor (e.g., p-type) layer of the LED film stack may be placed in contact with the bonding substrate with metal electrodes exposed on the top side. Method 901 then continues with operation 975 where a metal film is deposited over the LED elements and remainder of the bonding substrate surface. Exposed electrodes of the LED elements as well as any exposed cover-side interconnects present on the bonding substrate will also be covered with the metal film deposited at operation 975. In advantageous embodiments, the metal film is deposited with a technique that provides good step coverage (e.g., a conformal deposition process). After metal deposition a patterning of the metal film may be performed, for example using any known lithographic patterning and metal etch process known for the particular metal composition. The patterning operation is to electrically isolate locales of metal to LED elements, removing the metal film from non-LED regions such as where an IC, sensor etc. is bonded to the bonding substrate. The metal patterning operation may further electrically isolate adjacent LED elements from each other. The metal patterning is non-critical in that for an exemplary 1-5 µm×1-5 µm LED element, the lateral dimensions of the metal patterning are in the micron range and overlay tolerances in the range of 2-5 µm.

Figure 10B:
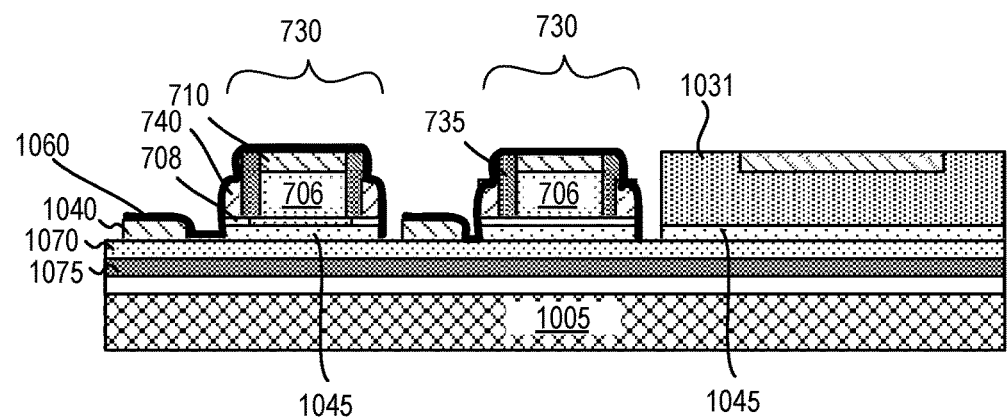
Figure 10C:
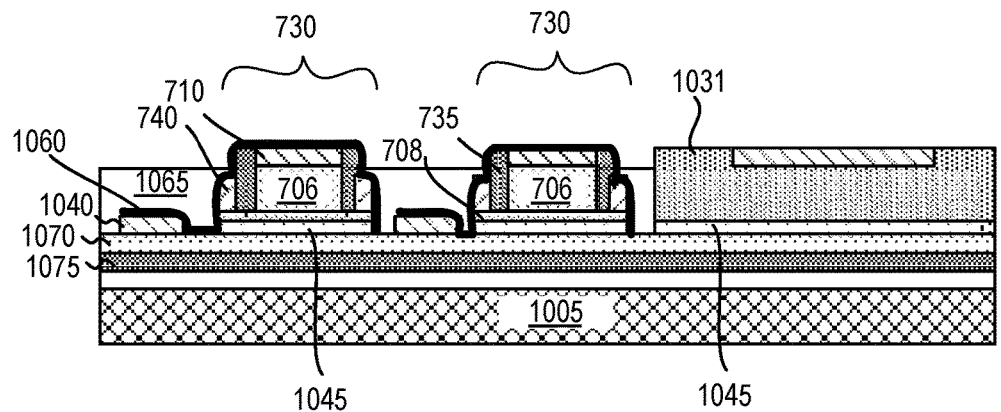
Figure 10D:
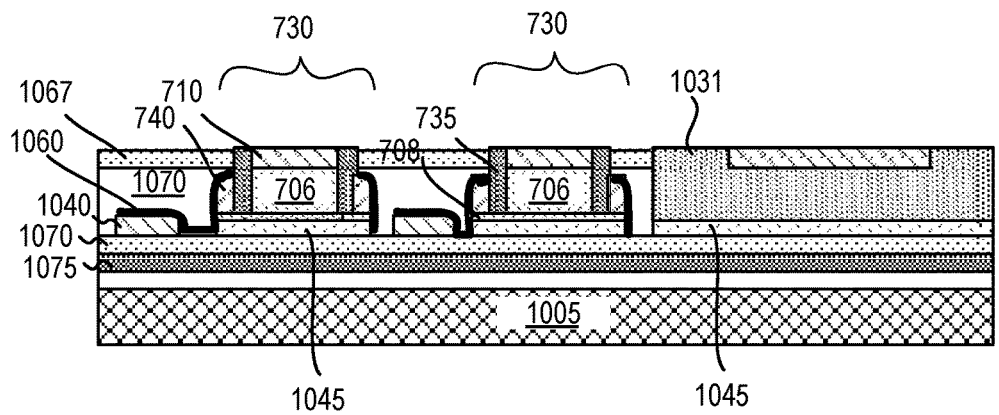
Figure 10E:
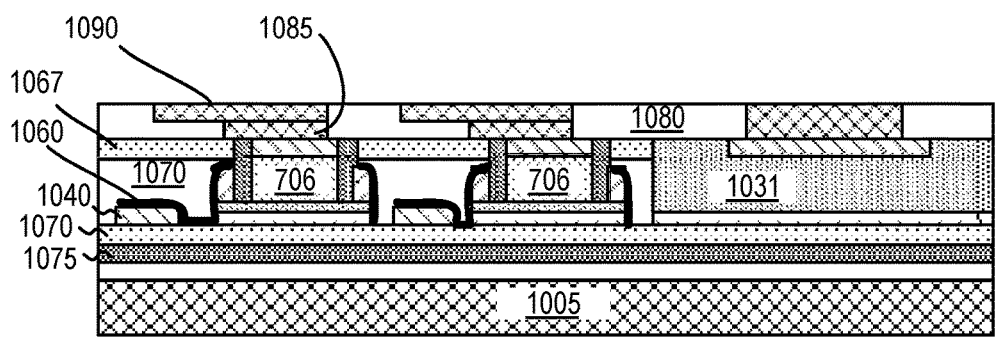
Figure 10F:
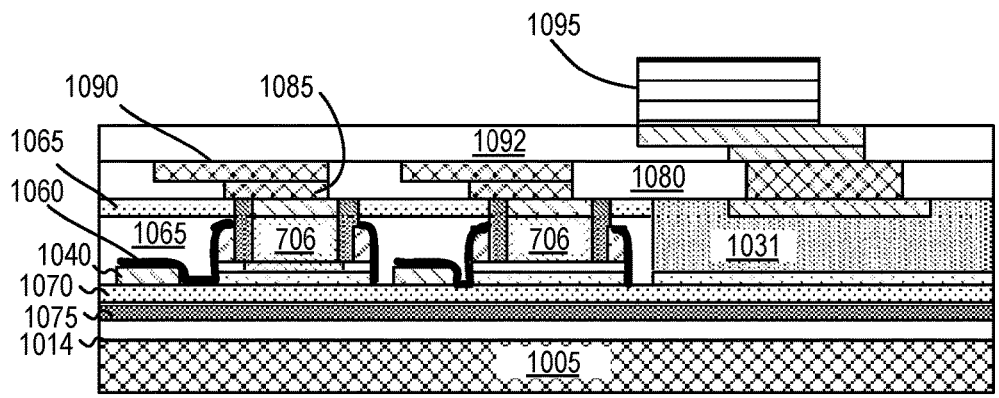

FIG. 10B illustrates one exemplary embodiment following the completion of operation 975. Two LED elements 730 are affixed (e.g., with any transfer print or pick-and-place technique) to bonding substrate 1005 by optically transmissive adhesive 1045 with doped semiconductor layer 708 in contact with adhesive 1045. IC 1031 has also been affixed to bonding substrate 1005 with optically transmissive adhesive 1045. Disposed over LED elements 730 is a metal local interconnect 1060, which is what remains of the metal film deposited at operation 975 after patterning. Local interconnect 1060 contacts at least a sidewall of metal LED electrode 740 and a cover-side interconnect 1040. In the exemplary embodiment, local interconnect 1060 is further disposed on a sidewall of the second doped semiconductor region 708, over dielectric spacer 735, and on metal LED electrode 710. As further illustrated in FIG. 10B, metal local interconnect 1060 has been patterned to remove the interconnect metal film from IC 1031 and to electrically separate the local interconnect between adjacent LED elements. Each local interconnect 1060 electrically couples one metal LED electrode 740 to one cover-side interconnect 1040 (although other patterning and interconnection of the local interconnect 1060 is possible).

Returning to FIG. 9, method 901 continues at operation 980 where a portion of the local interconnect contacting an Metal LED electrode and a cover-side interconnect is protected by depositing a first dielectric around the LED elements and recessing the dielectric below a top portion of the LED elements. As such, the dielectric may advantageously serve as a self-aligned non-sacrificial mask for a subsequent etch of unprotected portions of the local interconnect. In one advantageous embodiment, a spin-on dielectric may be utilized to planarize to a level above one of the LED electrodes, but not the other LED electrode. In the exemplary embodiment illustrated in FIG. 10C, dielectric 1065 is deposited over local interconnect 1060 that covers a sidewall of the second doped semiconductor region 708, a sidewall of metal LED electrode 740, dielectric spacer 735, and metal electrode 710, but the planarization process recesses dielectric 1065 to below metal LED electrode 710 and at least a portion of dielectric spacer 735.

Returning to FIG. 9, method 901 continues at operation 985 where the local interconnect metal exposed above the dielectric is etched. The metal etching is to isolate the LED electrodes from each other without breaking the self-aligned electrical interconnection between the one of the LED electrodes and the cover-side interconnect. Any metal etch process that provides sufficient selectivity to metal LED electrode 710 may be utilized at operation 985. As one example, operation 985 entails wet chemical etch selective to the local interconnect metal. Following the metal etch, at operation 987 a second dielectric is deposited. This dielectric covers exposed edges of the local interconnect metal (i.e., where the metal etch front was when the etching operation 985 is terminated). In the exemplary embodiment illustrated in FIG. 10D, the metal etching operation 985 entails removing metal local interconnect 1060 from metal LED electrode 710, and from at least the portion of dielectric spacer 735. Dielectric 1067 is then deposited and planarized around the LED elements 730 (and around IC 1031), surrounding a sidewall of metal LED electrode 710 and/or the portion of dielectric spacer 735 adjacent to a sidewall of metal LED electrode 710. In one advantageous embodiment, dielectric 1067 is a spin-on material, which may be of a same or different composition than dielectric 1065.

Returning to FIG. 9, method 901 continues at operation 990 where an interconnect is electrically coupled to the final LED electrode. In advantageous embodiments, operation 990 entails forming an unlanded contact to the LED electrode in reliance on the second dielectric applied at operation 987 serving as a stop, electrically isolating the unlanded interconnect from the local interconnect metal and/or the other LED electrode. The unlanded interconnect may be performed in any manner. In one exemplary embodiment, a dielectric is built up over the planarized LED elements and an opening etched through the build-up dielectric. The etch stops on the underlying dielectric and LED electrode metal. In the exemplary embodiment illustrated in FIG. 10E, unlanded contact 1085 electrically couples metal LED electrode 710 with a metal backplane interconnect 1090. Unlanded contact 1085 extends through a build-up dielectric 1080 disposed over dielectric 1067. Dielectric 1067 functions as an etch stop for unlanded contact 1085 as evidenced by unlanded contact 1085 laterally overhanging LED electrode 710, but not extending through dielectric 1067 and avoiding a short with local interconnect 1060. If desired, other interconnects at the level of interconnect 1090 can contact interconnects 1040/1060 through a separate via fabrication process (not shown in FIG. 10E).

Figure 10G:
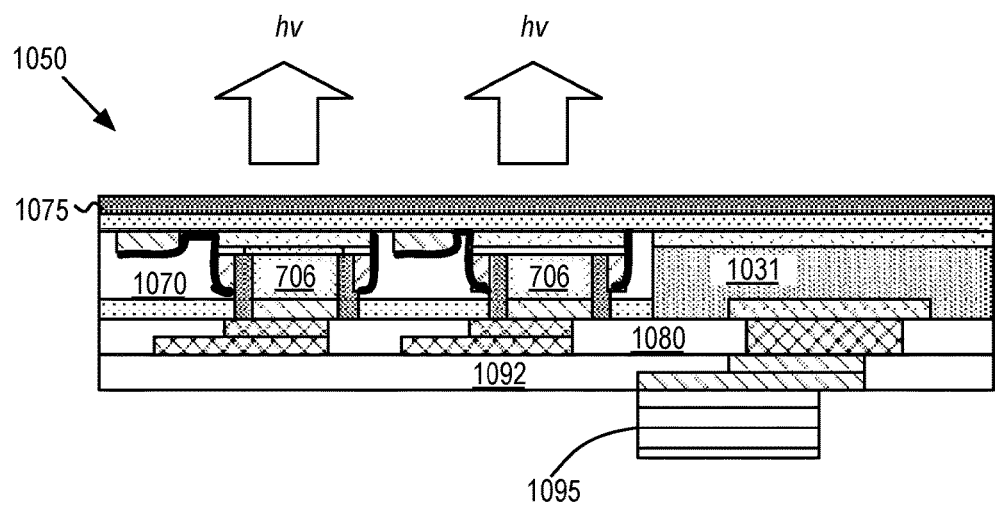

Returning to FIG. 9, method 901 continues at operation 993 where the dielectric and interconnect build-up continues, for example with ABF or alternative materials to further incorporate any display backplane interfaces and/or integrate discrete circuit elements, such as capacitors, inductors, or sensors either through wirebonding or solder bonding to the display backplane interface. In the exemplary embodiment illustrated in FIG. 10F, a discrete capacitor 1095 is solder bonded to an interconnect in build-up 1092. Returning to FIG. 9, method 901 continues at operation 995 where the LED build-up is separated from the bonding substrate using any technique known to be suitable for the particular type of coupling substrate employed in method 901. For example, in the embodiment illustrated in FIG. 10G, a laser debond/cut process is employed to separate substrate 1005 (e.g., glass) from display cover 1075 at the release layer 1014 (FIG. 10F) to arrive the illustrated crystalline LED display assembly 1050. Depending on the thickness and mechanical properties of display cover 1075 and the various dielectric build-up materials, crystalline LED display assembly 1050 may flexible, capable of a range of radii of curvature dependent primarily on the thickness of the display cover. As shown in FIG. 10G, LED light can pass through the optically transparent adhesive without additional optical loss through transparent conducting electrodes. This is beneficial for the power consumption of the display. Method 901 is then substantially complete with crystalline LED display assembly 1050 ready to be installed directly into an electronic device (e.g., mobile handset).

Figure 11:
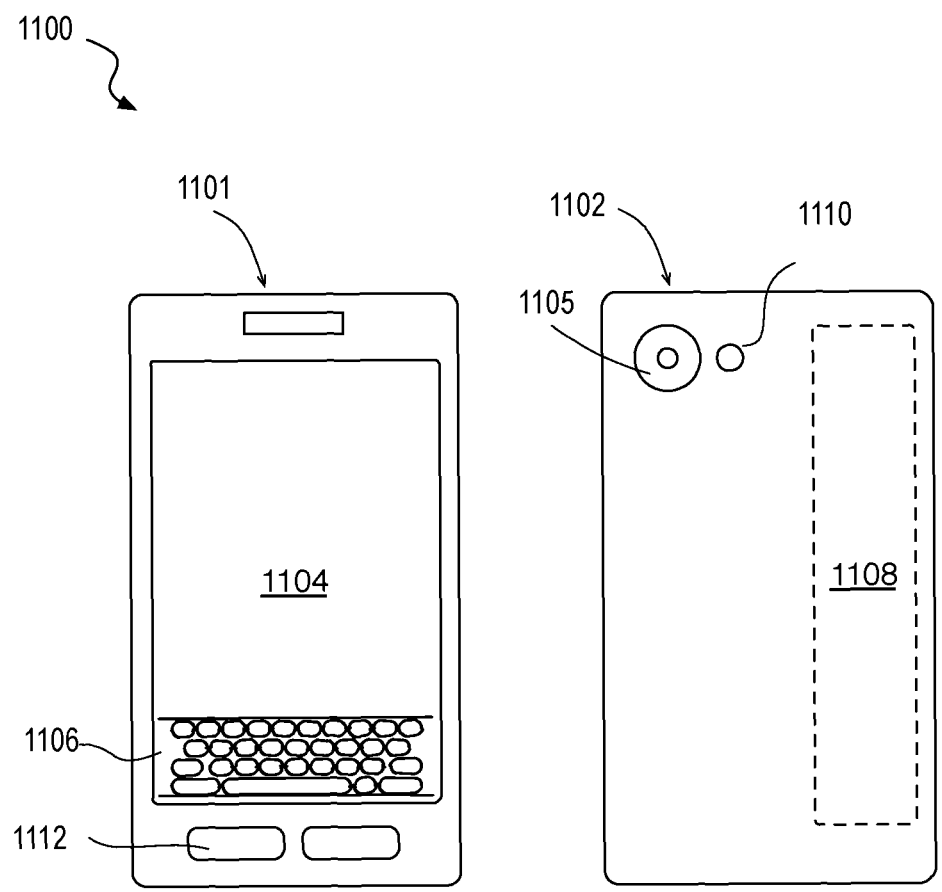
FIG. 11 illustrates front and back views of a mobile computing device incorporating a crystalline LED display in accordance with embodiments.

As described above, LED display assembly 501 or LED display assembly 1050 may be incorporated into an electronic device embodied in varying physical styles or form factors. FIG. 11 illustrates front and back views of a mobile computing handset device 700 incorporating a crystalline LED display in accordance with embodiments. In embodiments, for example, device 1100 may be implemented as a mobile computing device having wireless capabilities. A mobile computing device may refer to any device having a processing system and a mobile power source or supply, such as one or more batteries, for example. Examples of a mobile computing device may include an ultra-laptop computer, tablet, touch pad, portable computer, handheld computer, palmtop computer, personal digital assistant (PDA), cellular telephone, combination cellular telephone/PDA, television, smart device (e.g., smartphone, tablet or smart television), mobile internet device (MID), messaging device, data communication device, and so forth. Examples of a mobile computing device also may include computers and/or media capture/transmission devices configured to be worn by a person, such as a wrist computer, finger computer, ring computer, eyeglass computer, belt-clip computer, armband computer, shoe computers, clothing computers, and other wearable computers. In various embodiments, for example, a mobile computing device may be implemented as a smart phone capable of executing computer applications, as well as voice communications and/or data communications. Although some embodiments may be described with a mobile computing device implemented as a smart phone by way of example, it may be appreciated that other embodiments may be implemented using other wireless mobile computing devices as well. The embodiments are not limited in this context.

As shown in FIG. 11, mobile handset device 1100 may include a housing with a front 1101 and back 1102. Device 1100 includes a crystalline LED display assembly 1104, for example in accordance with exemplary embodiments described above. Device 1100 further includes an input/output (I/O) device 1106, and an integrated antenna 1108. Device 1100 also may include navigation features 1112. I/O device 1106 may include any suitable I/O device for entering information into a mobile computing device. Examples for I/O device 1106 may include an alphanumeric keyboard, a numeric keypad, a touch pad, input keys, buttons, switches, microphones, speakers, voice recognition device and software, and so forth. Information also may be entered into device 1100 by way of microphone (not shown), or may be digitized by a voice recognition device. Embodiments are not limited in this context. Integrated into at least the back 1102 is camera 1105 (e.g., including a lens, an aperture, and an imaging sensor), and a flash 1110, both of which may be components of a CM through which streaming video is displayed on crystalline LED display assembly 1104.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the inventive scope is not limited to the embodiments so described, but can be practiced with modification and alteration without departing from the scope of the appended claims. For example the above embodiments may include specific combinations of features as further provided below.

In one or more first embodiment, a crystalline LED display includes a display backplane interface including a plurality of backplane metal interconnects. The display further includes a plurality of LED elements. Each of the plurality of LED elements further include a semiconductor LED film stack, a first metal LED electrode in on a first surface of the LED film stack, and a second metal LED electrode on a second surface of the semiconductor film stack, opposite the first surface. The display further includes a plurality of conductive polymer elements, each of the conductive polymer elements electrically coupling the first metal LED electrode to at least one of the backplane metal interconnects.

In furtherance of the first embodiment, the display backplane interface further comprises an array of second metal interconnects. The display further comprises a plurality of optically transmissive conductive interconnects, each optically transmissive interconnect electrically coupled to the second metal electrode of at least one of the LED elements, and electrically coupled to at least one of the second metal interconnects.

In furtherance of the embodiment immediately above, the conductive polymer has a resistivity less 1 ohm-cm. Each of the plurality of LED elements has a length that is no more than 5 µm. The display further comprises an optically transmissive cover disposed over the plurality of LED elements, opposite the display backplane interface.

In furtherance of the first embodiment, each LED element further comprises a dielectric sidewall spacer over all semiconductor sidewalls of the LED film stack, all sidewalls of the first metal LED electrode, and a build-up material surrounds the dielectric sidewall spacer.

In one of more second embodiment, a crystalline LED display includes a display backplane interface including a plurality of backplane metal interconnects. The display further includes a plurality of LED elements. Each of the plurality of LED elements further includes a semiconductor LED film stack, a first metal LED electrode in on a first surface of the LED film stack, a second metal LED electrode on a second surface of the semiconductor film stack, opposite the first surface, and a dielectric sidewall spacer over semiconductor sidewalls of the LED film stack, over metal sidewalls of the first metal LED electrode, and metal sidewalls of the second metal LED electrode. The display further includes a build-up material surrounding the dielectric sidewall spacer.

In furtherance of the embodiment immediately above, each LED element further comprises a plurality of LEDs coupled to the first and second metal interconnects in electrical parallel through the conductive polymer and the optically transmissive conductive interconnect. Each LED within an LED element comprises a pillar of the LED film stack in direct contact with the first metal LED electrode and laterally spaced apart from other LEDs within the element by the sidewall spacer dielectric.

In one or more third embodiment, a crystalline LED display assembly method includes receiving a bonding substrate including a plurality of first metal interconnects arrayed over the substrate. The method includes applying a conductive polymer in direct contact with the first metal interconnects. The method includes affixing a plurality of LED elements to the conductive polymer, with a first metal LED electrode of each LED element in electrical contact with the conductive polymer. The method includes patterning the conductive polymer into a plurality of separate conductive polymer elements, each polymer element contacting at least one LED element and at least one of the first metal interconnects. The method includes building up the bonding substrate with a conductive interconnect in electrical contact with a second metal electrode of each LED element. The method includes affixing a cover to the build-up, the cover optically transmissive within the emission band of the LED elements. The method includes separating the bonding substrate from the build-up with the build-up retaining the plurality of LED elements.

In furtherance of the embodiment immediately above, patterning the conductive polymer into the plurality of separate conductive polymer elements further comprises depositing a photosensitive conductive film over the bonding substrate, and optically delineating the photosensitive conductive film into the conductive polymer elements in alignment with the first metal interconnects.

In furtherance of the third embodiment, patterning the conductive polymer into the plurality of separate conductive polymer elements is performed prior to affixing the plurality of LED elements to the conductive polymer.

In furtherance of the third embodiment, each of the plurality of LED elements further includes a semiconductor LED film stack, the first metal LED electrode is on a first side of the LED film stack, the second metal LED electrode is on a second side of the LED film stack, opposite the first side, and the display backplane interface further includes a plurality of second metal interconnects arrayed over the substrate.

In furtherance of the embodiment immediately above, affixing the LED elements to each of the plurality of conductive polymer elements further comprises a room temperature compression bonding of the first metal LED electrode to the conductive polymer.

In furtherance of the third embodiment, affixing the LED element to each of the plurality of conductive polymer elements further comprises picking up a plurality of the LED elements from a source substrate with a transfer print head, the second metal electrode of each LED element facing the print head, contacting the first metal electrode of each LED element with the conductive polymer, and separating the print head from the plurality of the LED elements.

In furtherance of the embodiment immediately above, the source substrate further comprises a plurality of LED elements affixed to a carrier with anchors disposed between adjacent ones of the plurality. The source substrate further comprises a dielectric sidewall spacer disposed over semiconductor sidewalls, sidewalls of the first metal electrode, and sidewalls of the second metal electrode of each LED element, the dielectric coating located between the anchors and the LED element. The source substrate further comprises a free space void located between the first metal electrode and the carrier, the void surrounding each of the anchors.

In one or more fourth embodiment, a crystalline LED bonding source substrate includes a carrier, and a plurality of LED elements disposed over the carrier. Each LED element further comprises a semiconductor LED film stack including at least first and second doped semiconductor regions disposed between a first metal LED electrode and a second metal LED electrode, the first metal LED electrode facing the carrier and spaced apart from the carrier by a free-space void. Each LED element further comprises a sidewall dielectric coating disposed over sidewalls of the LED film stack, the first metal LED electrode, and the second metal LED electrode. The LED bonding source substrate further includes a plurality of anchors disposed within trenches separating each LED element from adjacent LED elements, each of the anchors landing on the carrier and surrounded by the free-space void.

In furtherance of the fourth embodiment, the free-space void extends over the entire area of the LED element. Each of the plurality of anchors comprises a polymer pillar contacting the sidewall dielectric of at least two adjacent LED elements.

In furtherance of the fourth embodiment, a surface of the sidewall dielectric is planar with an exposed surface of the first metal electrode, and each of the plurality of anchors contacts the sidewall dielectric of at least two adjacent LED elements.

In furtherance of the embodiment immediately above, the footprint occupied by the first metal electrode is coincident with the footprint of the LED semiconductor film stack and second electrode.

In furtherance of the fourth embodiment, each LED element further comprises a plurality of LEDs in contact with the first metal electrode, each LED comprising a pillar of the LED semiconductor film stack and separated from adjacent LEDs by an intra-element trench that extends through the second metal electrode and the LED semiconductor film stack, and lands on the first metal electrode, and the dielectric sidewall coating backfills the intra-element trench.

In furtherance of the fourth embodiment, the LED semiconductor film stack comprises a III-N semiconductor, the carrier comprises a crystalline silicon substrate, and each of the LED elements has a lateral length no more than 5 µm.

In one or more fifth embodiment, a method of fabricating a crystalline LED bonding source substrate includes depositing a first metal electrode film over a semiconductor LED film stack covering an epitaxial substrate. The method includes transferring the LED film and electrode stack to a carrier, the first metal electrode film facing the carrier. The method includes depositing a second metal electrode film over the LED film stack. The method further includes forming a plurality of LED elements by etching trenches into the LED film stack, first metal electrode film, and the second metal electrode film, each LED element having sidewalls defined by the trench etching. The method further includes forming dielectric spacer over LED element sidewalls. The method further includes forming LED element anchors within the trenches, the anchors intersecting portions of the LED element sidewalls. The method further includes releasing the LED elements from the carrier except for the anchors by laterally etching a release layer between the LED element and the carrier.

In furtherance of the fifth embodiment, forming the plurality of LED elements by etching trenches further comprises performing a masked etch through the second metal electrode film, the LED film stack, and the first metal electrode film. Forming LED element anchors within the trenches further comprises recessing the release layer at the bottom of the trench unmasked by the dielectric spacer, and depositing the anchor material into trenches, filling at least the recessed release layer and a portion of the trench lined by the dielectric spacer.

In furtherance of the fifth embodiment, depositing the anchor material into trenches further comprises applying a photoresist over the LED elements. Forming the LED element anchors further comprises lithographically patterning the photoresist into the anchors.

In furtherance of the fifth embodiment, the method further includes depositing a protective dielectric material layer over the second metal electrode film, and removing the protective dielectric material layer after releasing the LED elements from the carrier.

In furtherance of the fifth embodiment, the method further comprises splitting each LED element into a plurality of LEDs with one or more intra-element trench etched through the second metal electrode film and the LED semiconductor film stack, the intra-element trench stopping on the first metal electrode film. Forming the dielectric spacer over the LED element sidewalls backfills the intra-element trenches.

In one or more sixth embodiment, a crystalline LED display comprises an optically transmissive cover. The LED display further comprises a display backplane interface having a plurality of metal backplane interconnects arrayed over a surface opposite the cover. The LED display further comprises a plurality of LED elements disposed between the display backplane interface and the cover. Each of the plurality of LED elements further includes an epitaxial semiconductor LED film stack. Each of the plurality of LED elements further includes a first metal LED electrode in electrical contact with one of the backplane interconnects and a first doped semiconductor region of the LED film stack. Each of the plurality of LED elements further includes a second metal LED electrode in contact with a second doped semiconductor region of the LED film stack, the second metal LED electrode forming a sidewall adjacent to the LED element and spaced apart from the first metal LED electrode by an intervening dielectric spacer. The display further includes a plurality of metal cover-side interconnects, each disposed between adjacent LED elements. The display further includes a plurality of metal local interconnects, each local interconnect electrically coupled to the second metal electrode of each LED element, and electrically coupled to at least one of the cover-side interconnects.

In furtherance of the sixth embodiment, the display further comprises an optically transmissive adhesive element disposed between the first metal LED electrode and the cover.

In furtherance of the sixth embodiment, each of the backplane interconnects comprises an unlanded contact to the first metal LED electrode, the unlanded contact overhanging the first metal LED electrode and separated from the second metal LED electrode by an intervening dielectric layer.

In furtherance of the sixth embodiment, the local interconnect contacts a sidewall of the second doped semiconductor region and a sidewall of the second metal LED electrode.

In furtherance of the sixth embodiment, the display further comprises one or more a touch sensor layer disposed between the LED elements and the cover. An optically transmissive adhesive element is disposed between the first metal LED electrode and the touch sensor layer. The cover-side interconnects are disposed on the touch sensor layer. The local interconnect extends over the touch sensor layer.

In furtherance of the sixth embodiment, the display further comprises at least one of an IC chip or sensor disposed over the touch sensor layer with an optically transmissive adhesive element disposed there between.

In one or more seventh embodiment, crystalline LED display assembly method comprises receiving an LED bonding substrate. The method comprises affixing a plurality of LED elements to the bonding substrate with an optically transmissive adhesive. Each of the LED elements further comprise an epitaxial semiconductor LED film stack, a first metal LED electrode in electrical contact with a first doped semiconductor region of the LED film stack, and a second metal LED electrode in contact with a second doped semiconductor region of the LED film stack, the second metal LED electrode forming a perimeter around the LED element and spaced apart from the first metal LED electrode by an intervening dielectric spacer. The method further comprises depositing a metal film over the first and second metal LED electrodes. The method further comprises protecting a portion of the metal film contacting the second metal electrode and cover-side interconnects by planarizing a first dielectric around the LED elements. The method further comprises recessing the metal film from the first metal LED electrodes by etching the unprotected portion of the metal film exposed above the planarized dielectric. The method further comprises masking the recessed metal film by planarizing a second dielectric around the LED elements. The method further comprises building up a dielectric over the planarized LED elements with a metal backplane interconnect contacting the first metal LED electrode. The method further comprises removing the bonding substrate from the LED build-up.

In furtherance of the seventh embodiment, the bonding substrate includes an array of metal cover-side interconnects and each LED element is adjacent to one of the cover-side interconnects. Depositing the metal film over the first and second metal LED electrodes further comprises depositing the metal film on a sidewall of the second doped semiconductor region of the LED film stack, a sidewall of the second metal LED electrode, over the dielectric spacer, on at least one of the cover-side interconnects, and on the first metal LED electrode.

In furtherance of the embodiment immediately above, protecting the portion of the metal film contacting the second metal electrode and cover-side interconnects further comprises depositing the first dielectric over the sidewall of the second doped semiconductor region of the LED film stack, the sidewall of the second metal LED electrode, the dielectric spacer, and the first metal LED electrode. Protecting the portion of the metal film contacting the second metal electrode and cover-side interconnects further comprises recessing the first dielectric below the first metal LED electrode, and at least a portion of the dielectric spacer.

In furtherance of the embodiment immediately above, etching the unprotected portion of the metal film further comprises removing the metal film from the first metal LED electrode and from at least the portion of the dielectric spacer. Planarizing the second dielectric around the LED elements further comprises depositing the second dielectric over an unetched portion of the metal film and over at least some of the exposed portion of the dielectric spacer.

In furtherance of the seventh embodiment, planarizing a second dielectric around the LED elements further comprises surrounding a sidewall of the first metal LED electrode. Building up the dielectric over the planarized LED elements with a metal backplane interconnect contacting the first metal LED electrode further comprises depositing a build-up dielectric over the second dielectric and over the first metal LED electrode, etching an opening through the build-up dielectric, the etching stopping on the second dielectric and on the first metal LED electrode, and coupling the first metal LED electrode exposed by the opening with the backplane interconnect.

In furtherance of the embodiment immediately above, the method further comprises affixing, with the optically transmissive adhesive, one or more IC or sensor to the bonding substrate adjacent to the LED elements. The method further comprises removing the metal film from the one or more IC or sensor by lithographic masking and metal etch. The method comprises etching an opening through the build-up dielectric further comprises etching a second opening through the build-up dielectric that exposes the one or more IC or sensor. The method comprises coupling the one or more IC or sensor exposed by the second opening with the backplane interconnect.

In furtherance of the seventh embodiment, the method further comprises removing the plurality of LED elements from a crystalline LED bonding source substrate including the plurality of LED elements removably anchored to a carrier.

In furtherance of the embodiment immediately above, the method further comprises fabricating the crystalline LED bonding source substrate, the fabricating including forming first metal LED electrodes in contact with the first doped semiconductor region of the LED film stack, forming a plurality of LED elements by etching trenches into the LED semiconductor film stack, the etching stopping on the second doped semiconductor region, forming a dielectric spacer around the first metal LED electrodes and a sidewall of the first doped semiconductor region, depositing the second metal LED electrode film in contact with a second doped semiconductor region of the LED film stack, self-aligning the second metal LED electrode with the dielectric spacer by performing an unmasked etch of the second metal LED electrode film, and releasing the LED elements from the carrier by laterally etching a release layer between the second doped semiconductor region and the carrier.

In one or more eighth embodiment, a crystalline LED bonding source substrate comprises a carrier, and a plurality of LED elements disposed over the carrier. Each LED element further comprises an epitaxial semiconductor LED film stack including at least first and second doped semiconductor regions, a first metal LED electrode in contact with the first doped semiconductor region, a dielectric sidewall spacer around the first metal LED electrode and a sidewall of the first doped semiconductor region, and a second metal LED electrode further comprising a metal spacer adjacent to the dielectric spacer and in electrical contact with the second doped semiconductor region. The LED bonding source substrate further comprises a plurality of anchors disposed within trenches separating each LED element from adjacent LED elements, each of the anchors landing on the carrier and surrounded by a free-space void between the carrier and LED elements.

In furtherance of the eighth embodiment, the free-space void extends over the entire area of the LED element, each of the plurality of anchors comprises a polymer pillar contacting the dielectric sidewall spacer or metal sidewall spacer of at least two adjacent LED elements.

In furtherance of the eighth embodiment, the dielectric sidewall spacer is planar with an exposed surface of the first metal electrode. The second metal electrode is recessed below the exposed surface of the first metal electrode. Each of the plurality of anchors contacts the second metal electrode of at least two adjacent LED elements.

In furtherance of the eighth embodiment, the dielectric sidewall spacer surrounds a perimeter of the first metal LED electrode. The second metal electrode surrounds a perimeter of the dielectric sidewall spacer.

In furtherance of the embodiment immediately above, each LED element further comprises a plurality of LEDs in contact with the first doped semiconductor region, each LED comprising a pillar of the LED semiconductor film stack and separated from adjacent LEDs by an intra-element trench that extends through the first metal electrode and the first doped semiconductor region, and lands on the second doped semiconductor region. The dielectric sidewall spacer is disposed on two opposite sidewalls of the intra-element trench. The metal sidewall spacer is disposed on a portion of the second doped semiconductor region within the intra-element trench adjacent to the dielectric sidewall spacer.

In furtherance of the eighth embodiment, the LED semiconductor film stack comprises a III-N semiconductor, the carrier comprises a crystalline silicon substrate, and each of the LED elements has a lateral length no more than 5 μm.

In one or more ninth embodiment, a method of fabricating a crystalline LED bonding source substrate comprises depositing a first metal electrode film over a contiguous epitaxial semiconductor LED film stack covering a carrier, the LED film stack including at least a first and a second complementary doped semiconductor region. The method further comprises patterning the first metal electrode film into a plurality of first metal LED electrodes. The method further comprises forming a plurality of LED elements by etching trenches into the LED semiconductor film stack, the etching stopping on the second doped semiconductor region. The method further comprises forming a dielectric sidewall spacer around the first metal LED electrodes and a sidewall of the first doped semiconductor region. The method further comprises depositing the second metal LED electrode film over the dielectric sidewall spacer and in contact with a second doped semiconductor region of the LED film stack. The method further comprises self-aligning the second metal LED electrode with the dielectric sidewall spacer by performing an unmasked etch of the second metal LED electrode film that forms a metal sidewall spacer adjacent to the dielectric sidewall spacer. The method further comprises forming LED element anchors within the trenches, the anchors intersecting adjacent LED elements. The method further comprises releasing the LED elements from the carrier except for the anchors by etching through the second doped semiconductor region of the LED film stack and laterally etching a release layer between the second doped semiconductor region and the carrier.

In furtherance of the ninth embodiment, the method further comprises performing an unmasked anisotropic etch of the second metal LED electrode film recesses the second Metal LED electrode below the first Metal LED electrode.

In furtherance of the ninth embodiment, the method further comprises receiving a monolithic LED epitaxial substrate including the contiguous epitaxial semiconductor LED film stack covering the substrate, and transferring the LED semiconductor film stack to the carrier with the release layer disposed between the carrier and the LED film stack.

In furtherance of the ninth embodiment, forming the LED element anchors within the trenches further comprises recessing the release layer at the bottom of the trench unmasked by the second metal LED electrode, and depositing the anchor material into trenches, filling at least the recessed release layer and a portion of the trench lined by the second metal LED electrode.

In furtherance of the embodiment immediately above, depositing the anchor material into trenches further comprises applying a photoresist over the LED elements, and forming the LED element anchors further comprises lithographically patterning the photoresist into the anchors.

In furtherance of the ninth embodiment, the method further comprises splitting each LED element into a plurality of LEDs with one or more intra-element trench etched through the first metal electrode film and at least the first doped semiconductor region of the LED film stack, the intra-element trench stopping on the second doped region of the LED film stack. The method further comprises forming the dielectric sidewall spacer over the LED element sidewalls exposes a portion of the second doped region of the LED film stack between adjacent portions of the dielectric sidewall spacer. The method further comprises self-aligning the second metal LED electrode with the dielectric sidewall spacer backfills the exposed portion of the second doped region with the second metal LED electrode.

In one or more tenth embodiment, an LED element includes an epitaxial semiconductor LED film stack including at least first and second doped semiconductor regions. The LED element further includes a first metal LED electrode in contact with the first doped semiconductor region. The LED element further includes a dielectric sidewall spacer around the first metal LED electrode and a sidewall of the first doped semiconductor region. The LED element further includes a second metal LED electrode further comprising a metal sidewall spacer adjacent to the dielectric sidewall spacer, and in electrical contact with the second doped semiconductor region.

In furtherance of the tenth embodiment, the first metal LED electrode has a footprint of at least 1 μm$^2$. The dielectric sidewall spacer has a lateral width less than 0.1 μm. The metal sidewall spacer has a lateral width less than 0.1 μm.

In furtherance of the tenth embodiment, the dielectric sidewall spacer is planar with an exposed surface of the first metal electrode. The second metal electrode is recessed below the surface of the first metal electrode.

In furtherance of the tenth embodiment, the dielectric sidewall spacer surrounds a perimeter of the first metal LED electrode, and the metal sidewall spacer surrounds a perimeter of the dielectric spacer.

In furtherance of the tenth embodiment, the LED element further comprises a plurality of LEDs in contact with the first doped semiconductor region. Each LED comprises a pillar of the LED semiconductor film stack and separated from adjacent LEDs by an intra-element trench that extends through the first doped semiconductor region, and lands on the second doped semiconductor region. The dielectric sidewall spacer is disposed on two opposite sidewalls of the intra-element trench. The metal sidewall spacer is disposed on a portion of the second doped semiconductor region within the intra-element trench adjacent to the dielectric sidewall spacer.

In furtherance of the embodiment immediately above, the metal sidewall spacer backfills a space between adjacent regions of dielectric sidewall spacer.

In one or more eleventh embodiment, a method of fabricating a crystalline LED comprises depositing a first metal electrode film over a contiguous epitaxial semiconductor LED film stack disposed over a substrate, the LED film stack including at least first and second complementary doped semiconductor regions. The method further comprises patterning the first metal electrode film into a plurality of first metal LED electrodes. The method further comprises forming a plurality of LED elements by etching trenches into the LED semiconductor film stack, the etching stopping on the second doped semiconductor region. The method further comprises forming a dielectric sidewall spacer around the first metal LED electrodes and a sidewall of the first doped semiconductor region. The method further comprises depositing the second metal LED electrode film over the dielectric sidewall spacer and in contact with the second doped semiconductor region of the LED film stack. The method further comprises self-aligning the second metal LED electrode with the dielectric sidewall spacer by performing an unmasked etch of the second metal LED electrode film that forms a metal sidewall spacer adjacent to the dielectric sidewall spacer.

In furtherance of the embodiment immediately above, performing an unmasked anisotropic etch of the second metal LED electrode film recesses the second Metal LED electrode below the first Metal LED electrode.

In furtherance of the eleventh embodiment, the method further comprises splitting each LED element into a plurality of LEDs with one or more intra-element trench etched through the first metal electrode film and at least the first doped semiconductor region of the LED film stack, the intra-element trench stopping on the second doped region of the LED film stack. Forming the dielectric sidewall spacer over the LED element sidewalls exposes a portion of the second doped region of the LED film stack between adjacent portions of the dielectric sidewall spacer. Self-aligning the second metal LED electrode with the dielectric sidewall spacer backfills the exposed portion of the second doped region with the second metal LED electrode.

However, the embodiments are not limited to the examples above, and in various implementations the above embodiments may include the undertaking only a subset of such features, undertaking a different order of such features, undertaking a different combination of such features, and/or undertaking additional features than those features explicitly listed. The inventive scope should, therefore, be determined with reference to the appended claims, along with the full scope of equivalents to which such claims are entitled.

What is claimed is:

1. A crystalline LED display, comprising:
   an optically transmissive cover;
   a display backplane interface having a plurality of metal backplane interconnects arrayed over a surface opposite the cover;
   a plurality of LED elements disposed between the display backplane interface and the cover, each of the plurality of LED elements further including:
   an epitaxial semiconductor LED film stack;
   a first metal LED electrode in electrical contact with one of the backplane interconnects and a first doped semiconductor region of the LED film stack; and
   a second metal LED electrode in contact with a second doped semiconductor region of the LED film stack, the second metal LED electrode forming a sidewall adjacent to the LED element and spaced apart from the first metal LED electrode by an intervening dielectric spacer;
   a plurality of metal cover-side interconnects, each disposed between adjacent LED elements; and
   a plurality of metal local interconnects, each local interconnect electrically coupled to the second metal electrode of each LED element, and electrically coupled to at least one of the cover-side interconnects.

2. The display of claim 1, further comprising:
   an optically transmissive adhesive element disposed between the first metal LED electrode and the cover.

3. The display of claim 1, wherein each of the backplane interconnects comprises an unlanded contact to the first metal LED electrode, the unlanded contact overhanging the first metal LED electrode and separated from the second metal LED electrode by an intervening dielectric layer.

4. The display of claim 2, wherein the local interconnect contacts a sidewall of the second doped semiconductor region and a sidewall of the second metal LED electrode.

5. The display of claim 2, further comprising one or more a touch sensor layer disposed between the LED elements and the cover, and wherein:
   an optically transmissive adhesive element is disposed between the first metal LED electrode and the touch sensor layer;
   the cover-side interconnects are disposed on the touch sensor layer; and
   the local interconnect extends over the touch sensor layer.

6. The display of claim 1, further comprising at least one of an IC chip or sensor disposed over the touch sensor layer with an optically transmissive adhesive element disposed there between.

7. A crystalline LED bonding source substrate, comprising:
   a carrier;
   a plurality of LED elements disposed over the carrier, wherein each LED element further comprises:
   an epitaxial semiconductor LED film stack including at least first and second doped semiconductor regions;
   a first metal LED electrode in contact with the first doped semiconductor region;
   a dielectric sidewall spacer around the first metal LED electrode and a sidewall of the first doped semiconductor region; and
   a second metal LED electrode further comprising a metal spacer adjacent to the dielectric spacer and in electrical contact with the second doped semiconductor region; and
   a plurality of anchors disposed within trenches separating each LED element from adjacent LED elements, each of the anchors landing on the carrier and surrounded by a free-space void between the carrier and LED elements.

8. The LED bonding source substrate of claim 7, wherein:
   the free-space void extends over the entire area of the LED element;
   each of the plurality of anchors comprises a polymer pillar contacting the dielectric sidewall spacer or metal sidewall spacer of at least two adjacent LED elements.

9. The LED bonding source substrate of claim 7, wherein:
   the dielectric sidewall spacer is planar with an exposed surface of the first metal electrode;
   the second metal electrode is recessed below the exposed surface of the first metal electrode; and
   each of the plurality of anchors contacts the second metal electrode of at least two adjacent LED elements.

10. The LED bonding source substrate of claim 7, wherein:
    the dielectric sidewall spacer surrounds a perimeter of the first metal LED electrode; and
    the second metal LED electrode surrounds a perimeter of the dielectric sidewall spacer.

11. The LED bonding source substrate of claim 7, wherein:
    each LED element further comprises a plurality of LEDs in contact with the first doped semiconductor region, each LED comprising a pillar of the LED semiconductor film stack and separated from adjacent LEDs by an intra-element trench that extends through the first metal electrode and the first doped semiconductor region, and lands on the second doped semiconductor region; and
    the dielectric sidewall spacer is disposed on two opposite sidewalls of the intra-element trench; and
    the metal sidewall spacer is disposed on a portion of the second doped semiconductor region within the intra-element trench adjacent to the dielectric sidewall spacer.

12. The LED bonding source substrate of claim 7, wherein:
    the LED semiconductor film stack comprises a III-N semiconductor;
    the carrier comprises a crystalline silicon substrate; and
    each of the LED elements has a lateral length no more than 5 μm.

13. An LED element, comprising:
an epitaxial semiconductor LED film stack including at least first and second doped semiconductor regions;
a first metal LED electrode in contact with the first doped semiconductor region;
a dielectric sidewall spacer around the first metal LED electrode and a sidewall of the first doped semiconductor region; and
a second metal LED electrode further comprising a metal sidewall spacer adjacent to the dielectric sidewall spacer, and in electrical contact with the second doped semiconductor region.

14. The LED element of claim 13, wherein:
the first metal LED electrode has a footprint of at least 1 $\mu m^2$;
the dielectric sidewall spacer has a lateral width less than 0.1 $\mu m$; and
the metal sidewall spacer has a lateral width less than 0.1 $\mu m$.

15. The LED element of claim 13, wherein:
the dielectric sidewall spacer is planar with an exposed surface of the first metal electrode; and
the second metal electrode is recessed below a surface of the first metal electrode.

16. The LED element of claim 13, wherein:
the dielectric sidewall spacer surrounds a perimeter of the first metal LED electrode; and
the metal sidewall spacer surrounds a perimeter of the dielectric sidewall spacer.

17. The LED element of claim 13, wherein:
the LED element further comprises a plurality of LEDs in contact with the first doped semiconductor region, each LED comprising a pillar of the LED semiconductor film stack and separated from adjacent LEDs by an intra-element trench that extends through the first doped semiconductor region, and lands on the second doped semiconductor region;
the dielectric sidewall spacer is disposed on two opposite sidewalls of the intra-element trench; and
the metal sidewall spacer is disposed on a portion of the second doped semiconductor region within the intra-element trench adjacent to the dielectric sidewall spacer.

18. The LED element of claim 17, wherein the metal sidewall spacer backfills a space between adjacent regions of dielectric sidewall spacer.

* * * * *